(12) United States Patent
Kim et al.

(10) Patent No.: US 11,463,563 B2
(45) Date of Patent: Oct. 4, 2022

(54) ELECTRONIC DEVICE INCLUDING INDICATOR

(71) Applicant: Samsung Electronics Co., Ltd., Suwon-si (KR)

(72) Inventors: Taewon Kim, Suwon-si (KR); Minsoo Kim, Suwon-si (KR); Bongsub Kim, Suwon-si (KR); Sangmin Lee, Suwon-si (KR); Jongheon Lee, Suwon-si (KR); Jiwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 16/829,340

(22) Filed: Mar. 25, 2020

(65) Prior Publication Data
US 2020/0314222 A1  Oct. 1, 2020

(30) Foreign Application Priority Data
Mar. 28, 2019  (KR) .......................... 10-2019-0035518

(51) Int. Cl.
*H04M 1/02* (2006.01)
*H05K 5/00* (2006.01)
(Continued)

(52) U.S. Cl.
CPC ........ *H04M 1/0218* (2013.01); *G02B 6/0055* (2013.01); *G02B 6/0088* (2013.01);
(Continued)

(58) Field of Classification Search
CPC .......................... H04M 1/0218; H04M 1/0268; G02B 6/0055; G02B 6/0088; G02B 6/0091; H05K 5/0017; H05K 5/0026
See application file for complete search history.

(56) References Cited

U.S. PATENT DOCUMENTS

| 2011/0063783 A1* | 3/2011 | Shim ..................... G06F 1/1615 361/679.01 |
| 2014/0218321 A1 | 8/2014 | Lee et al. |

(Continued)

FOREIGN PATENT DOCUMENTS

| JP | 10-200463 | * | 7/1998 |
| JP | 10-200463 A | | 7/1998 |

(Continued)

OTHER PUBLICATIONS

International Search Report dated Jun. 19, 2020, issued in International Application No. PCT/KR2020/003312.

*Primary Examiner* — Yuwen Pan
*Assistant Examiner* — Angelica M Perez
(74) *Attorney, Agent, or Firm* — Jefferson IP Law, LLP

(57) ABSTRACT

An electronic device including an indicator is provided. The electronic device includes a first housing structure including a first face oriented in a first direction, and a second face oriented in a second direction opposite the first direction, a second housing structure including a third face oriented in a third direction, and a fourth face oriented in a fourth direction opposite the third direction, a hinge structure rotatably connecting the first housing structure and the second housing structure to each other, the hinge structure configured to provide a folding axis that is a rotating center of the first housing structure and the second housing structure, a flexible display extending from the first face to the third face across the hinge structure, and a hinge case disposed between the first housing structure and the second housing structure to accommodate the hinge structure therein to conceal or protect the hinge structure.

20 Claims, 10 Drawing Sheets

(51) Int. Cl.
 *F21V 8/00* (2006.01)
 *H05K 5/02* (2006.01)

(52) U.S. Cl.
 CPC ........ *G02B 6/0091* (2013.01); *H04M 1/0268* (2013.01); *H05K 5/0004* (2013.01); *H05K 5/0017* (2013.01); *H05K 5/0226* (2013.01)

(56) References Cited

U.S. PATENT DOCUMENTS

| | | |
|---|---|---|
| 2016/0109908 A1 | 4/2016 | Siddiqui |
| 2017/0131741 A1 | 5/2017 | In-Sung et al. |
| 2018/0024590 A1 | 1/2018 | Nakamura et al. |
| 2018/0129459 A1 | 5/2018 | Sylvan et al. |

FOREIGN PATENT DOCUMENTS

| | | | |
|---|---|---|---|
| JP | 2018-013849 A | | 1/2018 |
| KR | 10-2006-0008624 A | | 1/2006 |
| KR | 1020060008624 | * | 1/2006 |
| KR | 10-0630127 B1 | | 9/2006 |
| KR | 10-2014-0099133 A | | 8/2014 |

\* cited by examiner

ELECTRONIC DEVICE INCLUDING INDICATOR

CROSS-REFERENCE TO RELATED APPLICATION(S)

This application is based on and claims priority under 35 U.S.C. § 119 of a Korean patent application number 10-2019-0035518, filed on Mar. 28, 2019, in the Korean Intellectual Property Office, the disclosure of which is incorporated by reference herein in its entirety.

BACKGROUND

1. Field

The disclosure relates to an electronic device. More particularly, the disclosure relates to an electronic device including an indicator using a light-emitting element.

2. Description of Related Art

As electronic, information, and communication technologies have developed, various functions have come to be integrated into a single electronic device. For example, a smart phone includes functions of an audio reproduction device, an imaging device, and a digital diary, in addition to a communication function, and further various functions may be implemented in the smart phone through additional installation of applications.

Without being limited to the functions (e.g., applications) and information provided in an electronic device itself, the user is capable of searching for and selectively acquiring more information by connecting to a network. In connecting to a network, a direct connection scheme (e.g., wired communication) may provide fast and stable communication establishment, but a utilization region may be limited to a fixed position or a predetermined extent of space. In connecting to a network, a wireless communication scheme has fewer constraints on position and space, and the transmission speed and stability of the wireless communication scheme are gradually reaching the same level as those of the direct connection scheme. In the future, the wireless communication scheme is expected to provide faster and more stable communication establishment than the direct connection scheme.

As the use of personal and portable electronic devices such as smart phones is becoming more common, there is increasing user demand for portability and ease of use. For example, a touch screen display may provide a virtual keypad that replaces a physical input device (e.g., a keypad) while serving as an output device that outputs a screen, for example, visual information. As a result, electronic devices have come to be capable of providing the same or further improved usability (e.g., a larger screen) while being reduced in size. In the future, if a flexible (e.g., foldable or rollable) display is commercially available, the portability and ease of use of electronic devices is expected to be further improved.

The above information is presented as background information only to assist with an understanding of the disclosure. No determination has been made, and no assertion is made, as to whether any of the above might be applicable as prior art with regard to the disclosure.

SUMMARY

In an embodiment, when an event occurs (e.g., when a call or various messages are received), the electronic device may allow the user to recognize the occurrence of the event by activating the display or using sound or vibration. However, in the state in which the display is folded or rolled up, it may be difficult for a user to recognize the occurrence of the event even if the display is activated. In another embodiment, when the sound or vibration of the electronic device is deactivated, the user may not recognize the occurrence of the event in the state in which the display is folded or rolled up.

In another embodiment, the electronic device may further include a sub-display, for example, a display capable of outputting a screen to the outside even in the state in which the electronic device is folded or rolled up. However, depending on the position where the electronic device is placed, the sub-display may be blocked from view and thus limited to provide visual information to the user.

Aspects of the disclosure are to address at least the above-mentioned problems and/or disadvantages and to provide at least the advantages described below. Accordingly, an aspect of the disclosure is to provide an electronic device including an indicator that displays visual information at least in an environment in which the display is blocked from view.

Another aspect of the disclosure is to provide an electronic device including an indicator that implements various visual effects in the exterior thereof.

Additional aspects will be set forth in part in the description which follows and, in part, will be apparent from the description, or may be learned by practice of the presented embodiments.

In accordance with an aspect of the disclosure, an electronic device is provided. The electronic device includes a first housing structure including a first face oriented in a first direction, a second face oriented in a second direction opposite the first direction, and a first side member at least partially surrounding a space between the first face and the second face, a second housing structure including a third face oriented in a third direction, a fourth face oriented in a fourth direction opposite the third direction, and a second side member at least partially surrounding a space between the third face and the fourth face, a hinge structure rotatably connecting the first housing structure and the second housing structure to each other, the hinge structure configured to provide a folding axis that is a rotating center of the first housing structure and the second housing structure, a flexible display extending from the first face to the third face across the hinge structure, a hinge case disposed between the first housing structure and the second housing structure to accommodate therein the hinge structure to conceal or protect the hinge structure, and one or more first light-emitting elements disposed on an outer face of the hinge case. The electronic device may be configured to transmit light emitted from the one or more first light-emitting elements to outside of the electronic device.

In accordance with another aspect of the disclosure, an electronic device is provided. The electronic device includes a first housing structure, a second housing structure, a hinge structure disposed between the first housing structure and the second housing structure, the hinge structure being configured to couple the first housing structure and the second housing structure to be rotatable between a position at which the first housing structure and the second housing structure are unfolded to be arranged side by side with respect to each other (hereinafter, referred to as a "first position") and a position at which the first and second housing structures are folded to face each other (hereinafter, referred to as a "second" position), a flexible display extending from one face of the first housing structure to one face of the second housing structure across the hinge structure, a hinge case disposed between the first housing structure and the second housing structure to accommodate the hinge structure therein so as to conceal or protect the hinge structure, one or more first light-emitting elements disposed on an outer face of the hinge case, and an optical cover mounted on the outer face of the hinge case and including a translucent region formed in a region at least corresponding to the one or more first light-emitting elements. The one or more first light-emitting elements may emit light to outside of the electronic device through the translucent region.

According to various embodiments, the electronic device is capable of providing visual information to the user using the indicator even in an environment in which the display is concealed. For example, when an event such as reception of a call or a message occurs, the user easily recognizes the event. In an embodiment, the first light-emitting element constituting the indicator may emit red light, green light, blue light, or white light, and the electronic device is able to implement various visual effects on the exterior thereof using the first light-emitting element. For example, the indicator according to various embodiments may provide a visual decoration effect on the exterior of the electronic device while providing visual information about the occurrence of an event.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
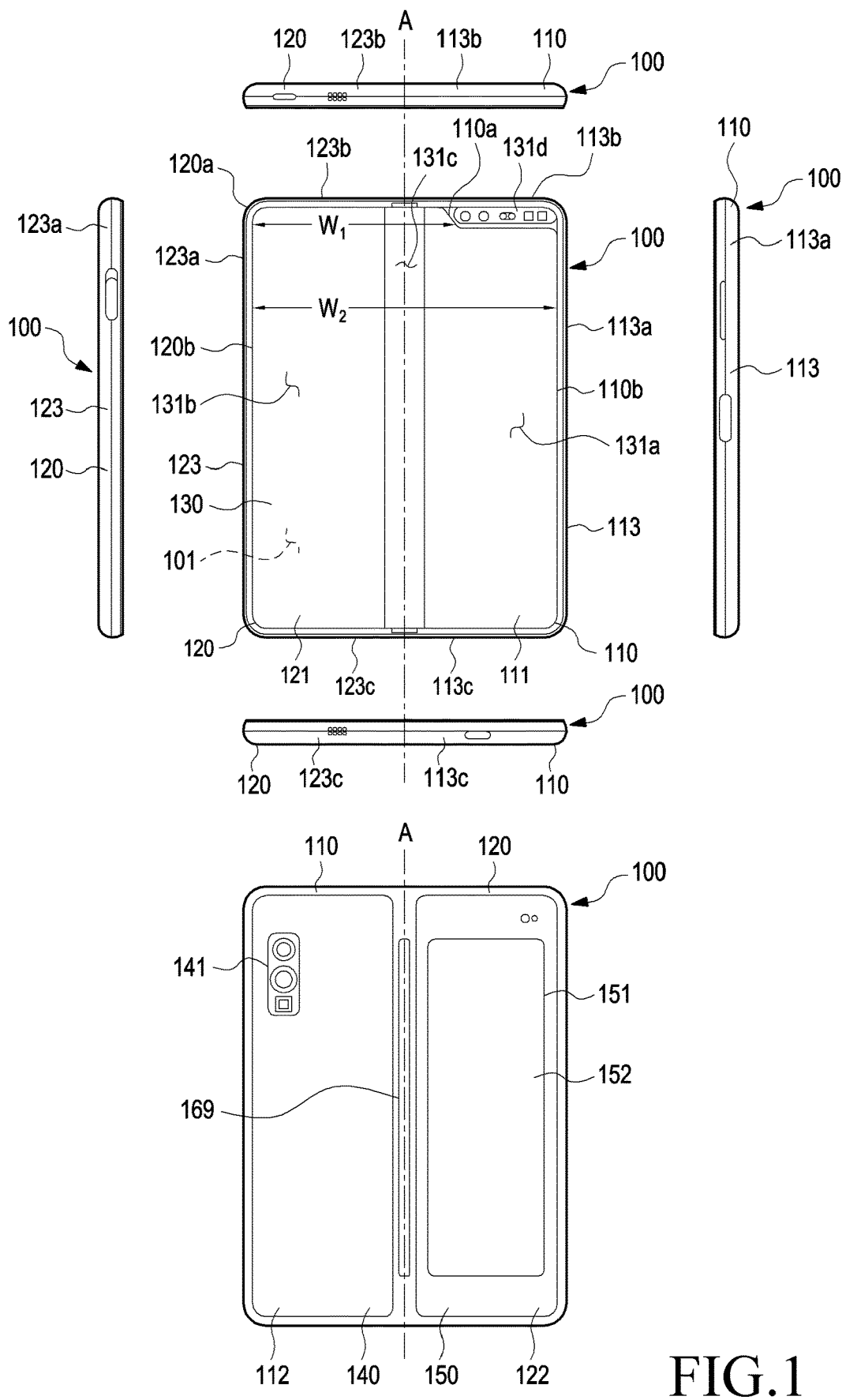
FIG. 1 is a perspective illustrating an electronic device in the unfolded state according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a perspective illustrating the unfolded state of an electronic device 100 according to an embodiment of the disclosure.

Figure 2:
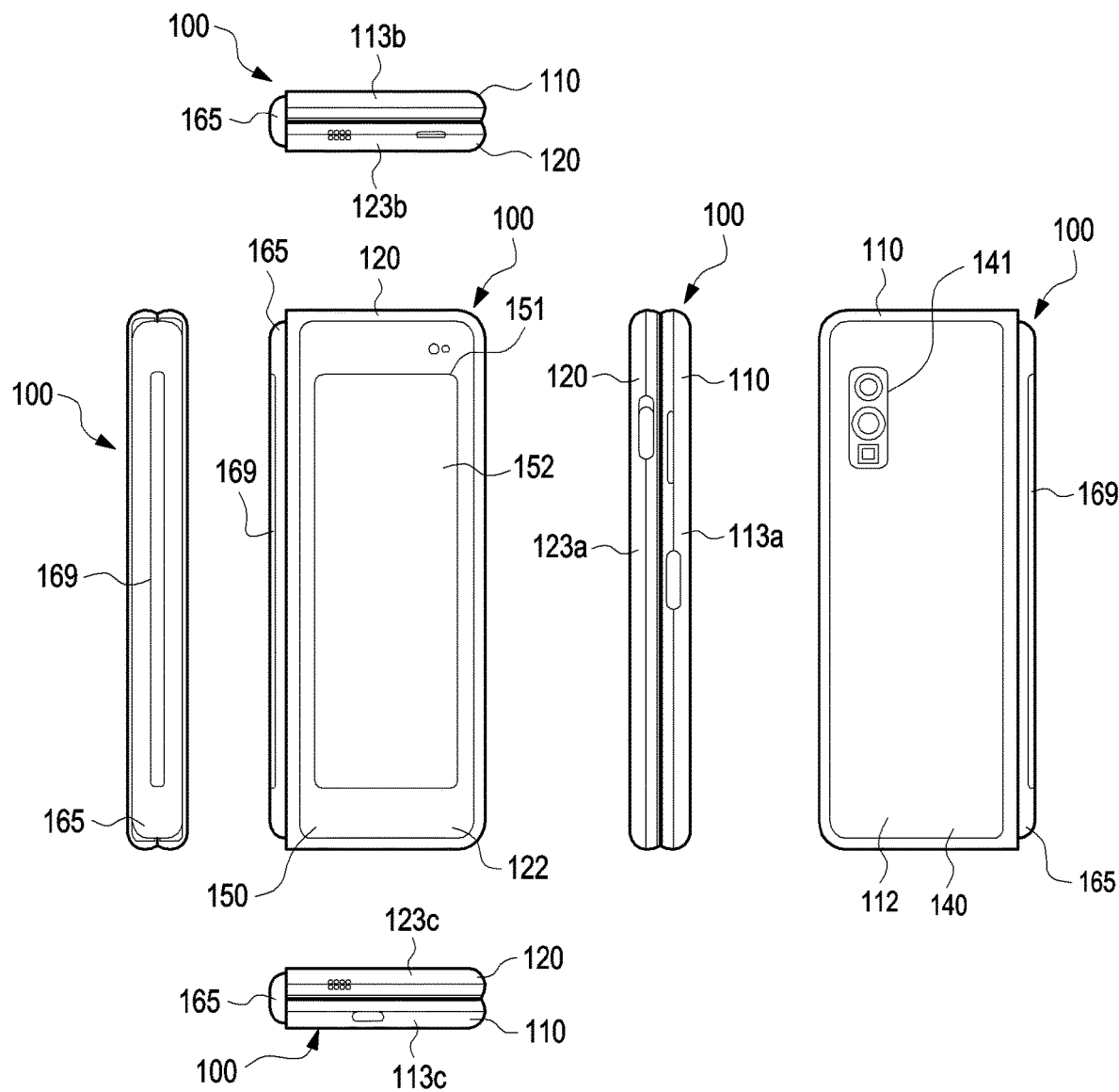
FIG. 2 is a view illustrating the electronic device of FIG. 1 in the folded state according to an embodiment of the disclosure.

FIG. 2 is a view illustrating the folded state of the electronic device 100 of FIG. 1 according to an embodiment of the disclosure.

In the following detailed description, a configuration in which a pair of housing structures are rotatably and/or pivotably coupled by a hinge structure may be exemplified. It is noted that an electronic device according to various embodiments disclosed herein is not limited by the embodiments. For example, an electronic device according to various embodiments disclosed herein may include three or more housing structures, and a pair of housing structures in the embodiments disclosed below may mean "two housing structures rotatably coupled to each other among three or more housing structures".

Referring to FIG. 1, an electronic device 100 may include a pair of housing structures 110 and 120 rotatably and/or pivotably coupled to each other via a hinge structure (e.g., the hinge structure 164 in FIG. 3) so as to be folded with respect to each other, a hinge cover 165 that covers the foldable portions of the pair of housing structures 110 and 120, and a display 130 (e.g., a flexible display or a foldable display) disposed in a space formed by the pair of housing structures 110 and 120. In an embodiment, the electronic device 100 may include a foldable housing in which the pair of housing structures 110 and 120 are coupled to be rotatable from a position at which the pair of housing structures 110 and 120 are folded to face each other to a position at which the pair of housing structures 110 and 120 are unfolded to be parallel to each other. Herein, a face on which the display 130 is disposed may be defined as a front face of the electronic device 100, and a face opposite the front face may be defined as a rear face of the electronic device 100. In addition, the face surrounding the space between the front face and the rear face may be defined as a side face of the electronic device 100.

In an embodiment, the pair of housing structures 110 and 120 may include a first housing structure 110 including a sensor region 131d, a second housing structure 120, a first rear cover 140, and a second rear cover 150. The pair of housing structures 110 and 120 of the electronic device 100 are not limited to the shape and assembly illustrated in FIGS. 1 and 2, but may be implemented by other shapes or other combinations and/or assemblies of components. For example, in another embodiment, the first housing structure 110 and the first rear cover 140 may be integrally formed, and the second housing structure 120 and the second rear cover 150 may be integrally formed. In another embodiment, the first housing structure 110 may include a first rear cover 140, and the second housing structure 120 may include a second rear cover 150.

According to an embodiment, the first housing structure 110 and the second housing structure 120 may be disposed on opposite sides about a first axis (e.g., a folding axis A), and may have generally symmetrical shapes with respect to the folding axis A. In some embodiments, the first housing structure 110 and the second housing structure 120 are rotatable with respect to the hinge structure 164 or the hinge cover 165 about different folding axes, respectively. For example, the first housing structure 110 and the second housing structure 120 may be coupled to the hinge structure 164 or the hinge cover 165 to be individually rotatable. By rotating the first housing structure 110 and the second housing structure 120 about the folding axis A or about different folding axes, respectively, it is possible to rotate the first housing structure 110 and the second housing structure 120 from the positions at which the first housing structure 110 and the second housing structure 120 are folded to each other to the positions at which the first housing structure 110 and the second housing structure 120 are inclined with respect to each other or the positions at which the first housing structure 110 and the second housing structure 120 are unfolded to be parallel to each other.

Herein, the wording "positioned side by side" or "extended side by side" may mean the state in which two structures are at least partially positioned next to each other or the state in which at least portions positioned next to each other are arranged parallel. In some embodiments, the wording "arranged side by side" may mean that the two structures are arranged to look in parallel or in the same direction while being located next to each other. Expressions such as "side by side", "parallel", and the like may be used in the following detailed description, which will be readily understood according to the shapes or arrangements of the structures with reference to the accompanying drawings.

According to an embodiment, the angle or difference between the first housing structure 110 and the second housing structure 120 may vary depending on whether the electronic device 100 is in the unfolded state (the extended state, flat state, or open state), in the folded state, or in the intermediate state. According to an embodiment, unlike the second housing structure 120, the first housing structure 110 may further include the sensor region 131*d* in which various sensors are disposed. However, the first housing structure 110 and the second housing structure 120 may have mutually symmetrical shapes in the regions other than the sensor region 131*d*. In another embodiment, the sensor region 131*d* may be further disposed in or replaced with at least one region of the second housing structure 120.

In an embodiment, in the unfolded state of the electronic device 100, the first housing structure 110 may include a first face 111 connected to a hinge structure (e.g., the hinge structure 164 in FIG. 3) and arranged to face the front side of the electronic device 100, a second face 112 facing away from the first face 111, and a first side member 113 surrounding at least a part of the space between the first face 111 and the second face 112. In an embodiment, the first side member 113 may include a first side face 113*a* arranged parallel to the folding axis A, a second side face 113*b* extending from one end of the first side face 113*a* in a direction perpendicular to the folding axis A, and a third face 113*c* extending from the other end of the first side face 113*a* in a direction perpendicular to the folding axis A. In describing various embodiments, expressions such as "parallel" or "perpendicular" are used in connection with the arrangements of the above-described side faces, but in some embodiments, the expressions may include the meaning of "partially parallel" or "partially perpendicular". In some embodiments, expressions such as "parallel" or "perpendicular" may include an inclined arrangement relationship in an angular range within 10 degrees.

In an embodiment, in the unfolded state of the electronic device 100, the second housing structure 120 may include a third face 121 connected to the hinge structure (e.g., the hinge structure 164 in FIG. 3) and arranged to face the front side of the electronic device 100, a fourth face 122 facing away from the third face 121, and a second side member 123 surrounding at least a part of the space between the third face 121 and the fourth face 122. In an embodiment, the second side member 123 may include a fourth side face 123*a* arranged parallel to the folding axis A, a fifth side face 123*b* extending from one end of the fourth side face 123*a* in a direction perpendicular to the folding axis A, and a sixth face 123*c* extending from the other end of the fourth side face 123*a* in a direction perpendicular to the folding axis A. In an embodiment, in the folded state, the third face 121 may face the first face 111. In some embodiments, although there are some differences in specific shapes, the second side member 123 may be made, in shape and material, to be substantially the same as the first side member 113.

In an embodiment, the electronic device 100 may include a recess 101 formed to accommodate the display 130 through structural shape coupling of the first housing structure 110 and the second housing structure 120. The recess 101 may have substantially the same size as the display 130. In an embodiment, due to the sensor region 131*d*, the recess 101 may have two or more different widths in a direction perpendicular to the folding axis A. For example, the recess 101 may have a first width $w_1$ between a first portion 120*a* of the second housing structure 120, which is parallel to the folding axis A and a first portion 110*a* formed at an edge of the sensor region 131*d* of the first housing structure 110 and a second width $w_2$ between a second portion 120*b* of the second housing structure 120 and a second portion 110*b* of the first housing structure 110, which does not correspond to the sensor region 131*d* and is parallel to the folding axis A. In this case, the second width $w_2$ may be longer than the first width $w_1$. For example, the recess 101 may have the first width $W_1$ formed from the first portion 110*a* of the first housing structure 110 to the first portion 120*a* of the second housing structure 120, which are asymmetric to each other, and the second width $W_2$ formed from the second portion 110*b* of the first housing structure 110 to the second portion 120*b* of the second housing structure 120, which are symmetric to each other. In an embodiment, the first portion 110*a* and the second portion 110*b* of the first housing structure 110 may have different distances from the folding axis A, respectively. The widths of the recess 101 are not limited to the illustrated example. In various embodiments, the recess 101 may have two or more different widths due to the shape of the sensor region 131*d* or the asymmetric portions of the first housing structure 110 and the second housing structure 120.

In an embodiment, the first housing structure 110 and the second housing structure 120 may be at least partially formed of a metal material or a non-metal material having the rigidity of a level selected in order to support the display 130. In another embodiment, the first housing structure 110 and the second housing structure 120 may at least partially include a conductive material. When the first housing structure 110 and the second housing structure 120 include a conductive material, the electronic device 100 may transmit/receive radio waves using the portions formed of the conductive material in the first housing structure 110 and the second housing structure 120. For example, a processor or a communication module of the electronic device 100 may perform wireless communication using a part of each of the first housing structure 110 and the second housing structure 120.

In an embodiment, the sensor region 131*d* may be formed to have a predetermined region adjacent to one corner of the first housing structure 110. However, the arrangement, shape, and size of the sensor region 131d is not limited to the illustrated example. For example, in another embodiment, the sensor region 131d may be provided at another corner of the first housing structure 110 or in any region between the upper and lower end corners. In another embodiment, the sensor region 131d may be disposed in at least one region of the second housing structure 120. In another embodiment, the sensor region 131d may be disposed to extend over the first housing structure 110 and the second housing structure 120. In an embodiment, the electronic device 100 may include components exposed to the front face of the electronic device 100 through the sensor region 131d or through one or more openings provided in the sensor region 131d, and may perform various functions using these components. In various embodiments, the components disposed in the sensor region 131d may include, for example, at least one of a front camera device, a proximity sensor, an illuminance sensor, an iris recognition sensor, an ultrasonic sensor, or an indicator.

In an embodiment, the first rear cover 140 may be disposed on the second face 112 of the first housing structure 110, and may have a substantially rectangular periphery. In an embodiment, the periphery of the first rear cover 140 may be at least partially wrapped by the first housing structure 110. Similarly, the second rear cover 150 may be disposed on the fourth face 122 of the second housing structure 120, and at least a portion of the periphery of the second rear cover 150 may be at least partially wrapped by the second housing structure 120.

In the illustrated embodiment, the first rear cover 140 and the second rear cover 150 may have substantially symmetrical shapes with respect to the folding axis A. According to another embodiment, the first rear cover 140 and the second rear cover 150 may have various different shapes. In a still another embodiment, the first rear cover 140 may be formed integrally with the first housing structure 110, and the second rear cover 150 may be formed integrally with the second housing structure 120.

In an embodiment, the first rear cover 140, the second rear cover 150, the first housing structure 110, and the second housing structure 120 may provide, through a mutually coupled structure, a space in which various components (e.g., a printed circuit board, an antenna module, a sensor module, or a battery) of the electronic device 100 may be arranged. According to an embodiment, one or more components may be disposed or visually exposed on the rear face of the electronic device 100. For example, one or more components or sensors may be visually exposed through a first rear region 141 of the first rear cover 140. In various embodiments, the sensors may include a proximity sensor, a rear camera, and/or a flash. In another embodiment, at least a portion of the sub-display 152 may be visually exposed through a second rear region 151 of the second rear cover 150.

The display 130 may be disposed in a space formed by the pair of housing structures 110 and 120. For example, the display 130 may be seated in the recess (e.g., the recess 101 in FIG. 1) formed by the pair of housing structures 110 and 120, and may be disposed to occupy substantially the majority of the front face of the electronic device 100. For example, the front face of the electronic device 100 may include the display 130, and a region (e.g., a peripheral region) of the first housing structure 110 and a region (e.g., a peripheral region) of the second housing structure 120, which are adjacent to the display 130. In an embodiment, the rear face of the electronic device 100 may include the first rear cover 140, a region (e.g., a peripheral region) of the first housing structure 110 adjacent to the first rear cover 140, the second rear cover 150, and a region (e.g., a peripheral region) of the second housing structure 120 adjacent to the second rear cover 150.

According to an embodiment, the display 130 may mean a display in which at least one region is deformable into a planar face or a curved face. In an embodiment, the display 130 may include a folding region 131c, a first region 131a disposed on one side of the folding region 131a (e.g., the right region of the folding region 131c), and a second region 131b disposed on the other side of the folding region 131c (e.g., the left region of the folding region 131c). For example, the first region 131a may be disposed in the first face 111 of the first housing structure 110, and the second region 131b may be disposed in the third face 121 of the second housing structure 120. For example, the display 130 may extend from the first face 111 to the third face across the hinge structure 164 in FIG. 3, and at least a region corresponding to the hinge structure (e.g., the folding region 131c) may be a flexible region that is deformable from a flat plate shape to a curved shape.

In an embodiment, the region division of the display 130 is exemplary, and the display 130 may be divided into multiple regions (e.g., four or more regions or two regions) depending on the structure or functions thereof. For example, in the embodiment illustrated in FIG. 1, the folding region 131c extends in the direction of the vertical axis (e.g., the y axis in FIG. 3) parallel to the folding axis A, and the regions of the display 130 may be divided with reference to the folding region 131c or the folding axis (the axis A). However, in another embodiment, the regions of the display 130 may be divided with reference to another folding region (e.g., a folding region parallel to the horizontal axis (e.g., the x axis in FIG. 3)) or another folding axis (e.g., a folding axis parallel to the x axis in FIG. 3). The aforementioned region division of the display is merely physical division based on the pair of housing structures 110 and 120 and the hinge structure (e.g., the hinge structure 164 in FIG. 3), and the display 130 may display one full screen substantially through the pair of housing structures 110 and 120 and the hinge structure (e.g., the hinge structure 164 in FIG. 3).

According to an embodiment, the first region 131a and the second region 131b may have generally symmetrical shapes about the folding region 131c. However, unlike the second region 131b, the first region 131a may include a notch region (e.g., the notch region 133 in FIG. 3), which provides the sensor region 131d. The first region 131a may have a shape symmetrical to the second region 131b in the region other than the sensor region. In other words, the first region 131a and the second region 131b may include mutually symmetrical portions and mutually asymmetrical portions.

Figure 3:
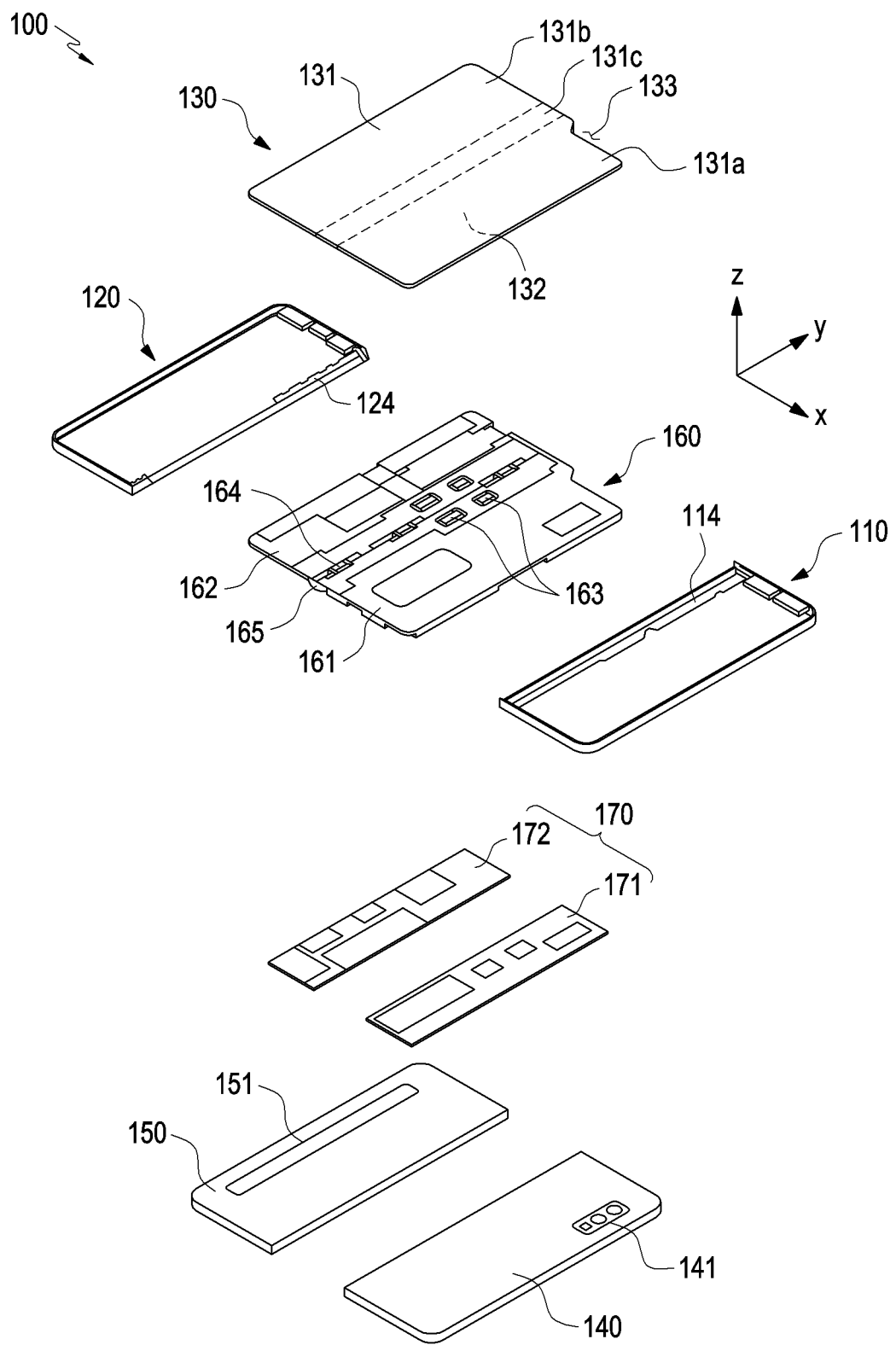
FIG. 3 is an exploded perspective view illustrating an electronic device according to an embodiment of the disclosure.

Referring to FIG. 3, the hinge cover 165 may be disposed between the first housing structure 110 and the second housing structure 120 so as to cover internal components (e.g., the hinge structure 164 in FIG. 3). In an embodiment, the hinge cover 165 may be covered by a portion of each of the first and second housing structures 110 and 120 or may be exposed to the outside depending on the operating state of the electronic device 100 (the unfolded state or the folded state). According to an embodiment, an indicator 169 may be disposed in the hinge cover 165. The indicator 169 may include a first light-emitting element 415 or a translucent region 421 to be described with reference to FIG. 4 or the like. According to an embodiment, the first light-emitting element 415 may be concealed from the exterior of the electronic device 100, and the light emitted by the first light-emitting element 415 may be transmitted to the outside of the electronic device 100 through the translucent region 421.

According to an embodiment, as illustrated in FIG. 1, when the electronic device 100 is in the unfolded state, the hinge cover 165 may be blocked from view by the first housing structure 110 and the second housing structure 120 so as not be exposed. In an embodiment, when the electronic device is in the unfolded state, a portion of the indicator 169 may be visually exposed between the first rear cover 140 and the second rear cover 150. As another example, as illustrated in FIG. 2, when the electronic device 100 is in the folded state (e.g., the completely folded state), the hinge cover 165 may be exposed to the outside between the first housing structure 110 and the second housing structure 120. As still another example, when the first housing structure 110 and the second housing structure 120 are in the intermediate state in which the first housing structure 110 and the second housing structure 120 are folded to form a predetermined angle therebetween, a portion of the hinge cover 165 may be exposed to the outside between the first housing structure 110 and the second housing structure 120. In this case, the exposed region may be smaller than that in the completely folded state. In an embodiment, the hinge cover 165 may include a curved face. According to an embodiment, when the electronic device is in the folded state or in the intermediate state, the indicator 169 may be more visually exposed than in the unfolded state. In another embodiment, when the electronic device is in the folded state, the indicator 169 (e.g., the translucent region 421 in FIG. 4) may be visually fully exposed. In another embodiment, the extent to which the indicator 169 is visually exposed may differ from that illustrated above depending on the shapes or positional relationship of the first housing structure 110 and the second housing structure 120. In some embodiments, even when the electronic device 100 is placed such that the sub-display 152 faces the floor in the folded state, the indicator 169 may not be blocked from view. For example, even when the display 130 or the sub-display 152 is in the state in which it is impossible for the display 130 or the sub-display 152 to provide visual information to the user, the indicator 169 may be exposed to the outside so as to provide visual information to the user.

Hereinafter, the operations of the first housing structure 110 and the second housing structure 120 and respective regions of the display 130 depending on the operating state of the electronic device 100 (e.g., the unfolded state (extended state) and the folded state) will be described.

In an embodiment, when the electronic device 100 is in the unfolded state (e.g., the state of FIG. 1), the first housing structure 110 and the second housing structure 120 may form an angle of 180 degrees therebetween, and the first region 131a and the second region 131b of the display may be disposed to face the same direction, for example, to display screens in parallel directions. In addition, the folding region 131c may form the same plane as the first region 131a and the second region 131b.

In an embodiment, when the electronic device 100 is in the folded state (e.g., the state of FIG. 2), the first housing structure 110 and the second housing structure 120 may be disposed to face each other. For example, when the electronic device 100 is in the folded state (e.g., the state of FIG. 2), the first region 131a and the second region 131b of the display 130 may form a narrow angle (e.g., 0 to 10 degrees) therebetween and may face each other. When the electronic device 100 is in the folded state (e.g., the state of FIG. 2), at least a portion of the folding region 131c may form a curved face having a predetermined curvature.

In an embodiment, when the electronic device 100 is in the intermediate state, the first housing structure 110 and the second housing structure 120 may be disposed to form therebetween a predetermined angle of, for example, 90 degrees or 120 degrees. For example, in the intermediate state, the first region 131a and the second region 131b of the display 130 may form therebetween an angle larger than that in the folded state and smaller than that in the unfolded state. At least a portion of the folding region 131c may be formed in a curved face having a predetermined curvature, and the curvature in this case may be smaller than that in the folded state.

FIG. 3 is an exploded perspective illustrating the electronic device 100 according to an embodiment of the disclosure.

Referring to FIG. 3, in an embodiment, the electronic device 100 may include a display 130, a support member assembly 160, at least one printed circuit board 170, a first housing structure 110, a second housing structure 120, a first rear cover 140, and a second rear cover 150. Herein, the display 130 may be referred to as a display module or a display assembly.

The display 130 may include a display panel 131 (e.g., a flexible display panel), and at least one plate 132 or layer on which the display panel 131 is seated. In an embodiment, the plate 132 may be disposed between the display panel 131 and the support member assembly 160. The display panel 131 may be disposed on at least a portion of one face (e.g., the face in the Z direction in FIG. 3) of the plate 132. The plate 132 may be formed in a shape corresponding to that of the display panel 131. For example, a region of the plate 132 may be formed in a shape corresponding to that of the notch region 133 in the display panel 131.

The support member assembly 160 may include a first support member 161, a second support member 162, a hinge structure 164 disposed between the first support member 161 and the second support member 162, a hinge cover 164 that covers the hinge structure 165 when the hinge structure 164 is viewed from the outside, and a wiring member 163 (e.g., a flexible printed circuit board (FPCB)) extending across the first and second support members 161 and 162.

In an embodiment, the support member assembly 160 may be disposed between the plate 132 and at least one printed circuit board 170. For example, the first support member 161 may be disposed between the first region 131a of the display 130 and a first printed circuit board 171. The second support member 162 may be disposed between the second region 131b of the display 130 and a second printed circuit board 172.

In an embodiment, the wiring member 163 and the hinge structure 164 may be at least partially disposed inside the support member assembly 160. The wiring member 163 may be disposed in a direction across the first support member 161 and the second support member 162 (e.g., the x-axis direction). The wiring member 163 may be disposed in a direction (e.g., the x-axis direction) perpendicular to the folding axis (e.g., the y axis or the folding axis A in FIG. 1) of the folding region 131c.

As described above, the at least one printed circuit board 170 may include the first printed circuit board 171 disposed on the first support member 161 side and the second printed circuit board 172 disposed on the second support member 162 side. The first printed circuit board 171 and the second printed circuit board 172 may be disposed in a space formed by the support member assembly 160, the first housing structure 110, the second housing structure 120, the first rear cover 140, and the second rear cover 150. Components for implementing various functions of the electronic device 100 may be mounted on the first printed circuit board 171 and the second printed circuit board 172.

In an embodiment, the first housing structure 110 and the second housing structure 120 may be assembled to each other so as to be coupled to the opposite sides of the support member assembly 160 in the state in which the display 130 is coupled to the support member assembly 160. The first housing structure 110 and the second housing structure 120 may be slidably coupled to the opposite sides of the support member assembly 160, for example, to the first support member 161 and the second support member 162, respectively. The first support member 161 and the second support member 162 are substantially accommodated in the first housing structure 110 and the second housing structure 120. According to an embodiment, the first support member 161 and the second support member 162 may be interpreted as portions of the first housing structure 110 and the second housing structure 120, respectively.

In an embodiment, the first housing structure 110 may include a first rotational support face 114 (e.g., a fourth side face 514 in FIG. 5 to be described later), and the second housing structure 120 may include a second rotational support face 124 (e.g., an eighth side face 524 in FIG. 5 to be described later), which corresponds to the first rotational support face 114. The first rotational support face 114 and the second rotational support face 124 may include curved faces corresponding to curved faces included in the hinge cover 165.

In an embodiment, when the electronic device 100 is in the unfolded state (e.g., the state of FIG. 1), the first rotational support face 114 and the second rotational support face 124 cover the hinge cover 165, so that the hinge cover 165 may not be exposed or may be minimally exposed to the rear face of the electronic device 100. In an embodiment, when the electronic device 100 is in the unfolded state (e.g., the state of FIG. 2), the first rotational support face 114 and the second rotational support face 124 rotate along the curved faces included in the hinge cover 165, so that the hinge cover 165 can be maximally exposed to the rear face of the electronic device 100.

In the foregoing detailed description, in the first housing structure 110, the second housing structure 120, the first side member 113, the second side member 123, and the like, ordinal numbers are used merely to distinguish components. It is noted that various embodiments are not limited by the description of the ordinal numbers. For example, although the sensor region 131d is illustrated as being formed in the first housing structure 110, the sensor region 131d may be formed in the second housing structure 120 or may be formed in both the first and second housing structures 110 and 120. In another embodiment, a configuration in which the first rear region 141 is disposed in the first rear cover 140 and the sub-display 152 is disposed on the second rear cover 150, is illustrated. However, both the first rear region 141 on which a sensor or the like is disposed and the sub display 152 for outputting a screen may be disposed on any one of the first rear cover 140 and the second rear cover 150.

In the following detailed description, the configuration of an indicator (e.g., the indicator 169 in FIG. 2) will be described with reference to FIG. 4 or the like, and the electronic device 100 of FIGS. 1 to 3 may be referred to as needed. In describing the following embodiments, the components that are the same as those of the preceding embodiments or can be easily understood through the preceding embodiments may be denoted by the same reference numerals or the reference numerals may be omitted, and the detailed descriptions thereof may also be omitted. In addition, hereinafter, the state of FIG. 1 in which the first housing structure 110 and the second housing structure 120 are unfolded to be arranged side by side in relation to each other may be referred to as a "first position", and the state of FIG. 2 in which the first housing structure 110 and the second housing structure 120 are folded to face each other may be referred to as a "second position".

Figure 4:
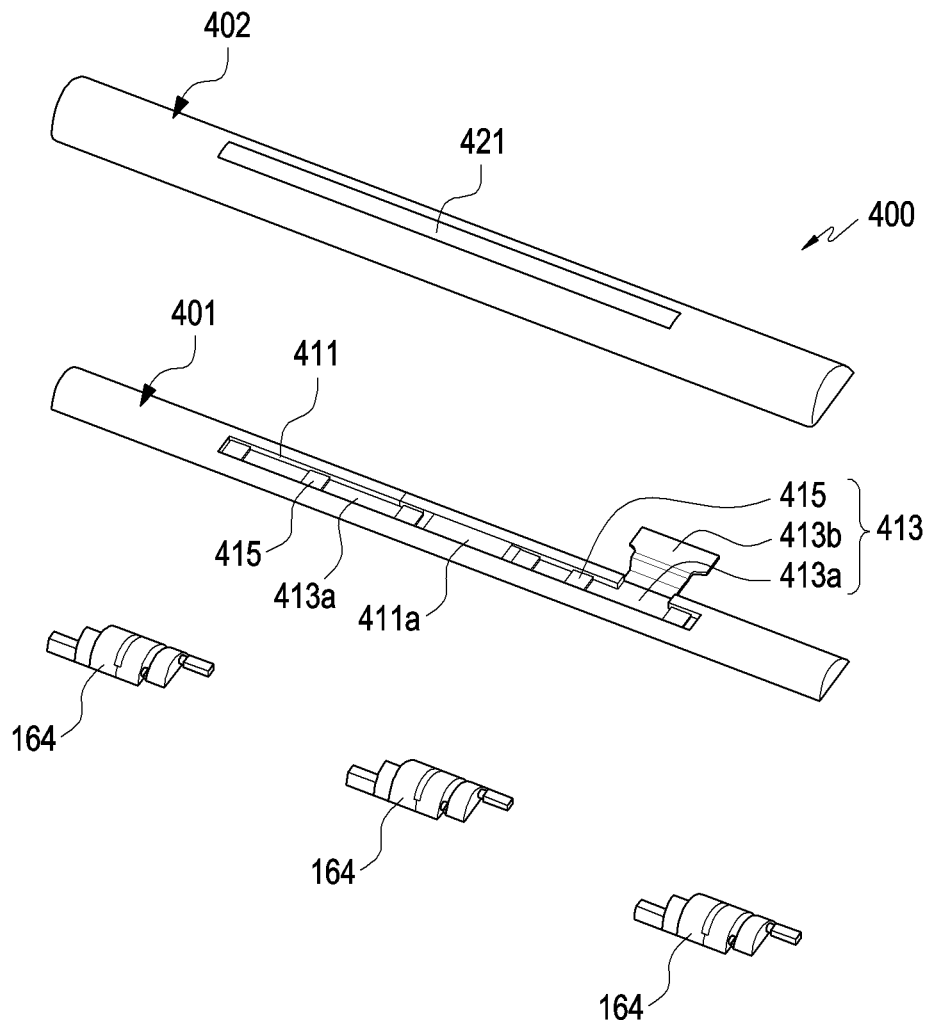
FIG. 4 is an exploded perspective view illustrating a hinge cover of an electronic device according to an embodiment of the disclosure.

FIG. 4 is an exploded perspective view illustrating a hinge cover (e.g., the hinge cover 165 in FIG. 2) of an electronic device (e.g., the electronic device 100 in FIG. 1) according to an embodiment of the disclosure.

Figure 5:
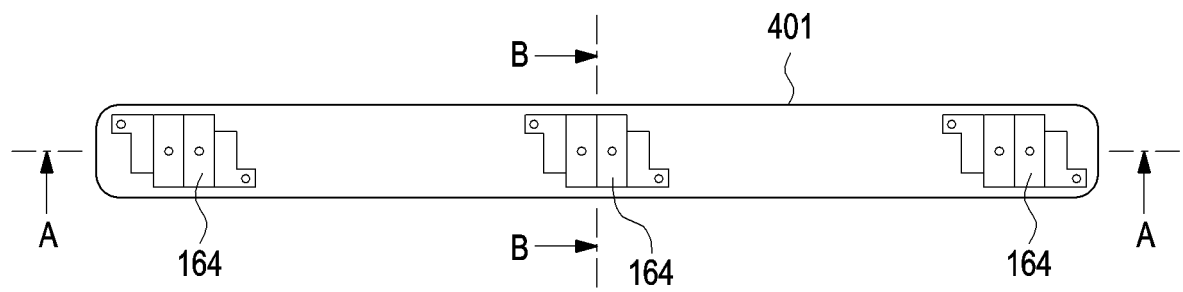
FIG. 5 is a plan view illustrating an inner face of a hinge cover according to an embodiment of the disclosure.

FIG. 5 is a plan view illustrating an inner face of a hinge cover 400 (e.g., the hinge case 401) according to an embodiment of the disclosure.

Referring to FIGS. 4 and 5, the hinge cover 400 of the electronic device may include a hinge case 401 and an optical cover 402, and may include at least one first light-emitting element 415 disposed between the hinge case 401 and the optical cover 402, for example, on the outer face of the hinge case 401. The optical cover 402 may be coupled to enclose the outer face of the hinge case 401, and may include a translucent region 421. The translucent region 421 may be located to at least correspond to the first light-emitting element 415, and may visually conceal the first light-emitting element 415 from the outside while transmitting light, emitted by the first light-emitting element 415, to the outside. For example, the indicator 169 of FIG. 1 or FIG. 2 may include the translucent region 421 and the first light-emitting element 415.

According to various embodiments, the hinge case 401 may accommodate the hinge structure 164 of FIG. 1 therein. One or more hinge structures 164 may be mounted on or fixed to an inner face of the hinge case 401 by fastening members such as screws. According to an embodiment, the hinge structures 164 may be mounted on the inner face of the central portion in the longitudinal direction of the hinge case 401 (e.g., the y direction in FIG. 3), and depending on the size of the electronic device (e.g., the electronic device 100 in FIG. 1), the hinge structures 164 may also be mounted at respective opposite ends of the hinge case 401. When two or more hinge structures 164 are disposed, an inner space (e.g., the inner space of the hinge case 401) between two adjacent hinge structures 164 may be used as a space for wiring that connects electronic components (e.g., the first printed circuit board 171 and the second printed circuit board 172 in FIG. 3) accommodated in each of the first and second housing structures (e.g., the first and second housing structures 110 and 120 in FIG. 1).

According to various embodiments, the hinge case 401 may include an accommodation recess 411 formed in the outer face thereof. The accommodation recess 411 is a space for accommodating or arranging the first light-emitting element 415 therein, and may at least partially extend in the longitudinal direction of the hinge case 401. According to various embodiments, the accommodation recess 411 may extend along a path that bypasses the central portion of the hinge case 401, for example, the portion in which the hinge structure 164 is mounted (hereinafter, referred to as a "mounting portion 411a"). According to an embodiment, in the portion in which the accommodation recess 411 is formed, the thickness of the hinge case 401 may be smaller than that of the other portions. When the hinge structure 164 is mounted in the portion having the smaller thickness, the fastening force of the fastening member may be reduced or may cause deformation of the hinge case 401. For example, by forming the accommodation recess 411 in a path or shape that does not overlap with the mounting portion 411a, it is possible to prevent the deformation of the hinge case 401 while stably mounting the hinge structure 164. The shape or size of the accommodation recess 411, the mounting portion 411a, or the placement portion 413a may vary. For example, the position or shape of the accommodation recess 411, the mounting portion 411a or the placement portion 413a in a region provided by the hinge case 401 may be different from that in the embodiment illustrated in the drawing. Modifications thereof will be further described with reference to FIG. 7, FIG. 10, FIG. 12, or FIG. 14.

According to various embodiments, the electronic device (e.g., the electronic device 100 in FIG. 1) may further include a flexible printed circuit board 413 disposed in the hinge cover 400. According to an embodiment, the flexible printed circuit board 413 may include a placement portion 413a fixed in the accommodation recess 411, and a connection portion 413b extending out of the accommodation recess 411 or the hinge case 401. The placement portion 413a may have a shape extending substantially in the longitudinal direction of the hinge case 401 or a shape bypassing the mounting portion 411a in a portion. The connection portion 413b may connect the placement portion 413a to another circuit board (e.g., the first printed circuit board 171 or the second printed circuit board 172 in FIG. 3).

According to various embodiments, at least one first light-emitting element 415 may be mounted on the placement portion 413a. In an embodiment, a plurality of first light-emitting elements 415 may be disposed in the longitudinal direction of the hinge case 401. As will be described with reference to FIG. 6, when the plurality of first light-emitting elements 415 are disposed, the first light-emitting elements 415 may be disposed at a predetermined interval. An interval at which the first light-emitting elements 415 are disposed may be determined based on the width of the mounting portion 411a (e.g., the length measured in the longitudinal direction of the hinge case 401). According to an embodiment, even if the mounting portion 411a is not formed, when sufficient space and mechanical strength for mounting the hinge structure 164 are secured, the interval between the first light-emitting elements 415 may be freely set. For example, when the mounting portion 411a is not formed, design freedom may be improved in the arrangement of the first light-emitting elements 415.

According to various embodiments, the optical cover 402 may be mounted on the outer face of the hinge case 401 so as to conceal or protect the first light-emitting elements 415, or the like. For example, the optical cover 402 may be made of a generally opaque or translucent material. In an embodiment, the optical cover 402 may include the translucent region 421 formed at least in the region in which the first light-emitting element 415 is disposed (or the region in which the plurality of first light-emitting elements 415 are arranged). For example, the translucent region 421 extends in the longitudinal direction of the hinge case 401 or the optical cover 402, and may be disposed to face at least the region in which the first light-emitting elements 415 are arranged.

According to various embodiments, the translucent region 421 may transmit the light, emitted by the first light-emitting elements 415, to the outside while preventing the first light-emitting elements 415 from being visually exposed to the outside (e.g., the outside of the electronic device 100 in FIG. 1 or FIG. 2). For example, the first light-emitting elements 415 emit light to the inner face of the translucent region 421, and the light emitted to the translucent region 421 at least partially passes through the translucent region 421. According to an embodiment, the first light-emitting elements 415 may include light-emitting diodes, and the electronic device (e.g., the electronic device 100 in FIGS. 1 to 3) may provide visual information to the user using the light emitted from the first light-emitting elements. For example, when an event such as call reception or message reception occurs, the electronic device may allow the user to recognize the event using the first light-emitting elements 415. In another embodiment, each of the first light-emitting elements 415 may emit at least one of red light, blue light, and green light. The electronic device (e.g., the electronic device 100 in FIG. 1 or FIG. 2) may provide various visual effects or decorative effects outside the electronic device by combining colors of light emitted by the first light-emitting elements 415.

Figure 6:
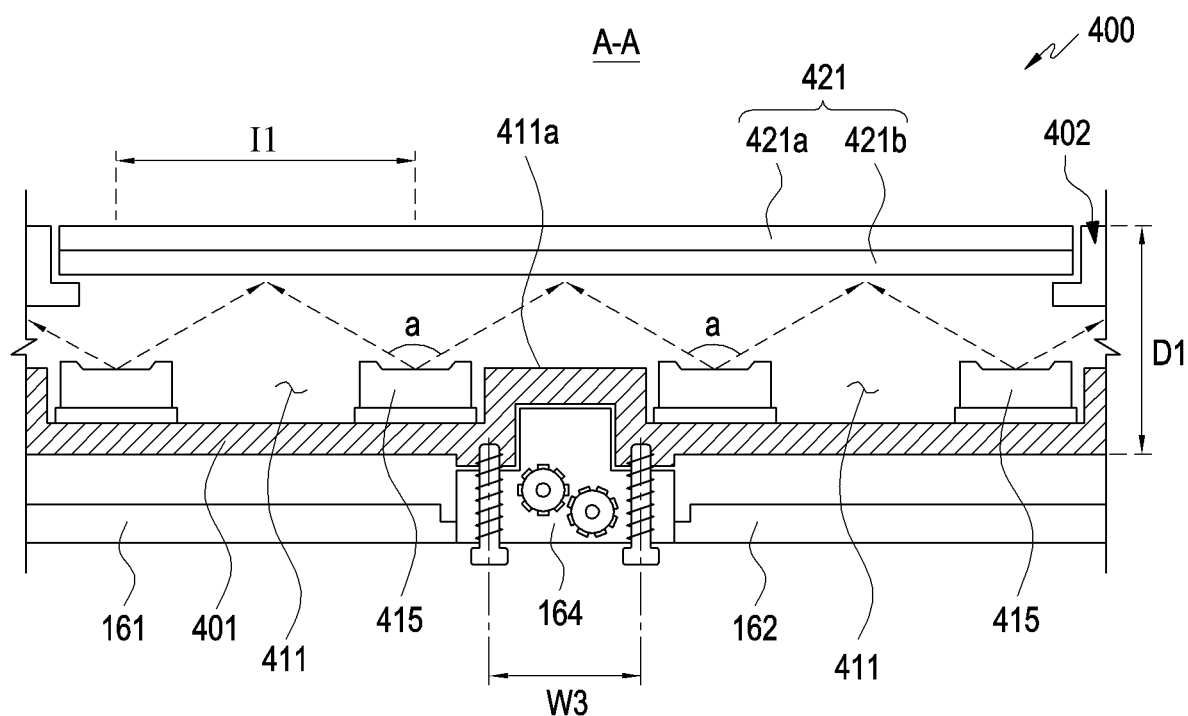
FIG. 6 is a cross-sectional view of the hinge cover taken along line A-A in FIG. 5 according to an embodiment of the disclosure.

FIG. 6 is a cross-sectional view of the hinge cover 400 taken along line A-A in FIG. 5 according to an embodiment of the disclosure.

Figure 7:
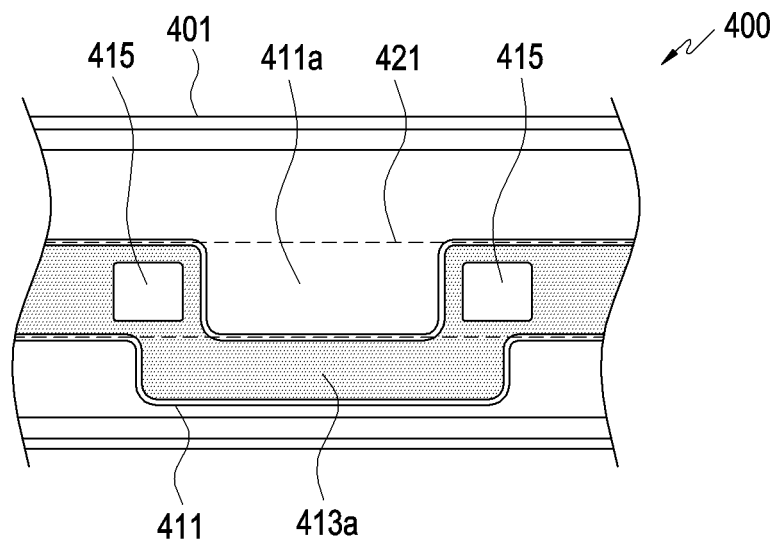
FIG. 7 is a projective plan view illustrating a portion of the hinge cover according to an embodiment of the disclosure.

FIG. 7 is a projective plan view illustrating a portion of the hinge cover 400 according to an embodiment of the disclosure.

Figure 8:
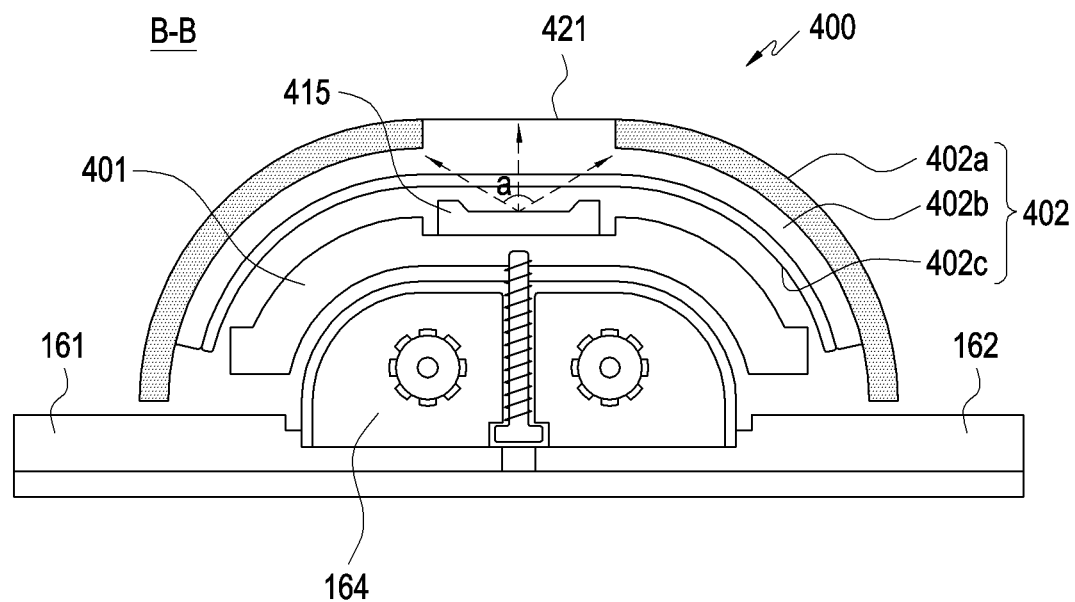
FIG. 8 is a cross-sectional view of the hinge cover taken along line B-B in FIG. 5 according to an embodiment of the disclosure.

FIG. 8 is a cross-sectional view of the hinge cover 400 taken along line B-B in FIG. 5 according to an embodiment of the disclosure.

Referring to FIGS. 6 to 8, the hinge structure 164 may be mounted on the mounting portion 411a inside the hinge case 401, and may rotatably and/or pivotably connect the first support member 161 and the second support member of FIG. 3. The first support member 161 and the second support member 162 may be part of the first housing structure 110 and the second housing structure 120 of the electronic device, whereby each of the first housing structure 110 and the second housing structure 120 is rotatable with respect to the hinge structure 164 or the hinge cover 400.

According to various embodiments, the plurality of first light-emitting elements 415 may be accommodated in the accommodation recess 411 on the outer face of the hinge case 401. The plurality of first light-emitting elements 415 may be arranged in the longitudinal direction of the hinge case 401 at a first interval I1. In an embodiment, the first interval I1 may be substantially the same as or larger than the length W3 of the mounting portion 411a measured in the longitudinal direction of the hinge case 401. In arranging the first light-emitting elements 415, a flexible printed circuit board (e.g., the flexible printed circuit board 413 in FIG. 4), for example, the placement portion 413a may generally extend in the longitudinal direction of the hinge case 401, and a portion of the placement portion 413a may be formed to bypass the mounting portion 411a. Thus, the accommodation recess 411 is formed in the hinge case 401 so as to accommodate the placement portion 413a or the first light-emitting elements 415, and the hinge structure 164 may be firmly mounted in the mounting portion 411a. In an embodiment, if it is possible to firmly mount the hinge structure 164 in the hinge case 401 even without forming the mounting portion 411a, it is not necessary for the accommodation recess 411 or the placement portion 413a to bypass the mounting portion 411a.

According to various embodiments, the optical cover 402 may be coupled to face the outer face of the hinge case 401 at a first distance D1. Referring to FIG. 6, the first distance D1 indicates the distance between the inner face of the hinge case 401 and the outer face of the optical cover 402, but may practically mean the distance between the face on which the first light-emitting elements 415 emit light and the inner face of the optical cover 402. In an embodiment, the optical cover 402 may include an opaque layer 402a, a translucent layer 402b, and a diffusion layer 402c. The opaque layer 402a may substantially form a part of the exterior of the optical cover 402 or the exterior of the electronic device (e.g., the electronic device 100 in FIG. 1). The translucent layer 402b is formed as an inner face of the opaque layer 402a, and may be partially exposed to the outside of the opaque layer 402a. For example, the opaque layer 402a may include an opening, and the translucent layer 402b may be accommodated in the opening of the opaque layer 402a and exposed to the outside. According to an embodiment, the translucent layer 402b exposed to the outside may substantially form the translucent region 421. For example, a region (e.g., the region indicated by "421a" in FIG. 6) exposed to the outside of the translucent layer 402b may correspond to the region in which the first light-emitting elements 415 are arranged. In another embodiment, the translucent layer 402b exposed to the outside may form the exterior of the optical cover 402 together with the opaque layer 402a. The diffusion layer 402c may be disposed on an inner face of the translucent layer 402b and may at least partially face the first light-emitting elements 415. For example, the first light-emitting elements 415 may emit light to the surface of the diffusion layer 402c. In an embodiment, the exposed region 421a in the translucent layer 402b and a region corresponding to the exposed region 421a in the diffusion layer 402c (e.g., the region indicated by "421b" in FIG. 6) may substantially form the translucent region 421. For example, the exposed region 421a and the region indicated by "421a" in FIG. 6 may be disposed to correspond to the region in which the first light-emitting elements 415 are arranged.

According to various embodiments, the light emitted from the first light-emitting elements 415 may be incident on the diffusion layer 402c and diffused through the translucent region 421. When the region, which is illuminated by light from one first light-emitting element 415, or the region, in which the diffusion layer 402c is able to diffuse light, is partially limited, the plurality of the first light-emitting elements 415 may be arranged so as to substantially illuminate the entire translucent region 421 with light therefrom. In an embodiment, light passing through the diffusion layer 402c may be transmitted to the outside through the translucent layer 402b.

According to various embodiments, the illumination angle a of the first light-emitting element 415 may not reach an angle of 180 degrees, and an area illuminated by light from one first light-emitting element 415 (hereinafter, an "illuminated area") may vary depending on the first distance D1. For example, when the optical cover 402 is disposed closer than the first distance D1 from the hinge case 401, an illuminated area may be reduced. In an embodiment, depending on the distance between the hinge case 401 and the optical cover 402 (e.g., the first distance D1), some sections or regions of the translucent region 421 in the longitudinal direction of the hinge cover 400 (e.g., the y direction in FIG. 3) may not be illuminated by light. In this case, the entire section or area of the translucent region 421 may be uniformly illuminated by adjusting the first interval I1 between the first light-emitting elements 415. For example, when the illuminated area is reduced, the entire section or area of the translucent region 421 may be illuminated by reducing the interval between the first light-emitting elements 415. In an embodiment, the regions illuminated by the first light-emitting elements 415 on the inner face of the translucent region 421 may be disposed to be in contact with each other. In another embodiment, the region illuminated by the first light-emitting elements 415 may be designed or manufactured to at least partially overlap each other in consideration of manufacturing tolerances, assembly tolerances, or the like of respective products. For example, at least 2 to 15% of the illuminated area of one first light-emitting element 415 may be designed or manufactured to overlap the illuminated area of another adjacent first light-emitting element. In some embodiments, the degree of overlap of the illuminated areas of two adjacent first light-emitting elements 415 may be determined in consideration of the thickness or the optical characteristic of the light-diffusing structure such as the diffusion layer 402c. For example, even if a narrow region at a point on the translucent region 421 is illuminated by light, when it is possible to diffuse the light to the entire translucent region 421, the light may be transmitted to the outside through the entire translucent region 421 even when only one first light-emitting element 415 is used. When the area in which the diffusion layer 402c is capable of diffusing light is limited, the arrangement interval of the first light-emitting elements 415 may be appropriately designed in consideration of this.

Figure 9:
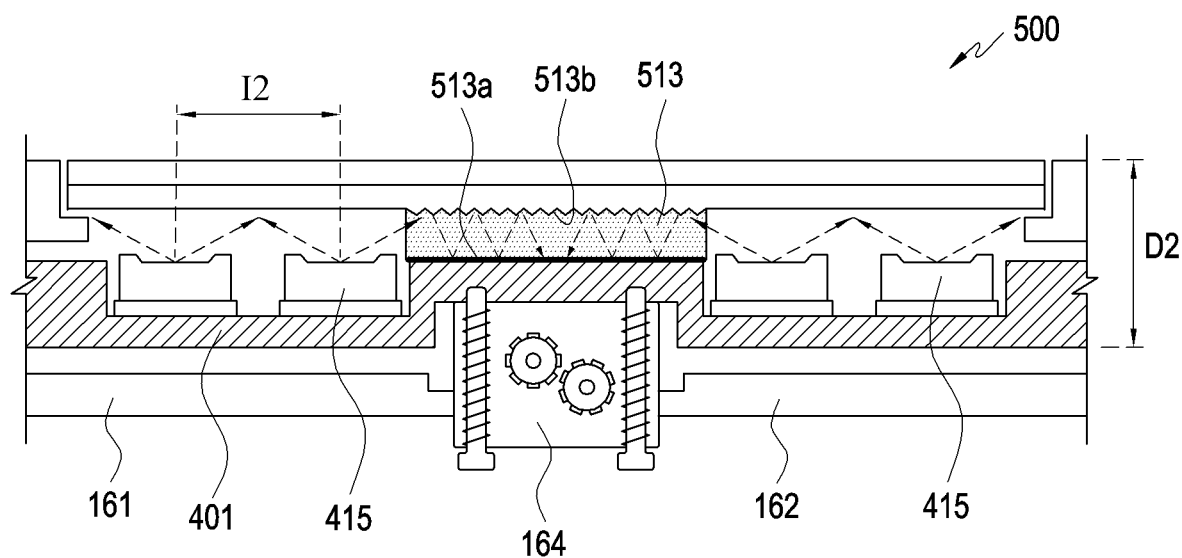
FIG. 9 is a cross-sectional view illustrating a hinge cover in which the hinge cover is cut in the longitudinal direction according to an embodiment of the disclosure.

FIG. 9 is a cross-sectional view illustrating a hinge cover 500 (e.g., the hinge cover 400 in FIG. 4) in which the hinge cover 500 is cut in the longitudinal direction according to an embodiment of the disclosure.

Figure 10:
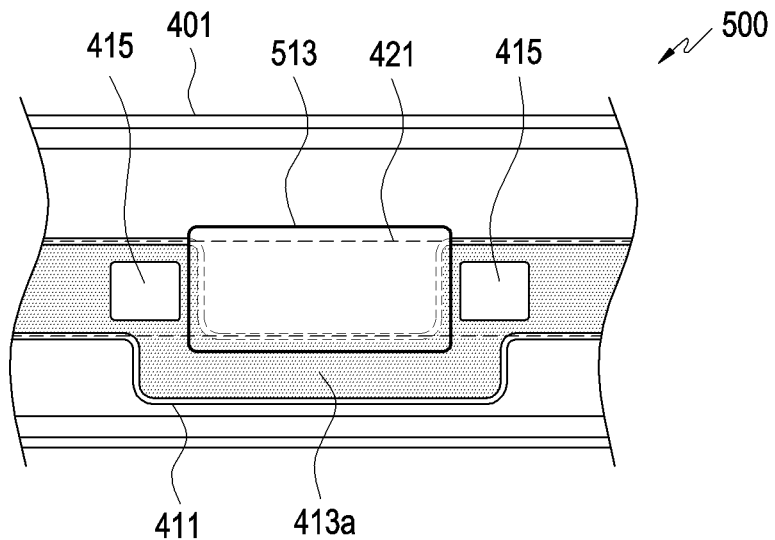
FIG. 10 is a projective plan view illustrating a portion of a hinge cover according to an embodiment of the disclosure.

FIG. 10 is a projective plan view illustrating a portion of the hinge cover 500 according to an embodiment of the disclosure.

Figure 11:
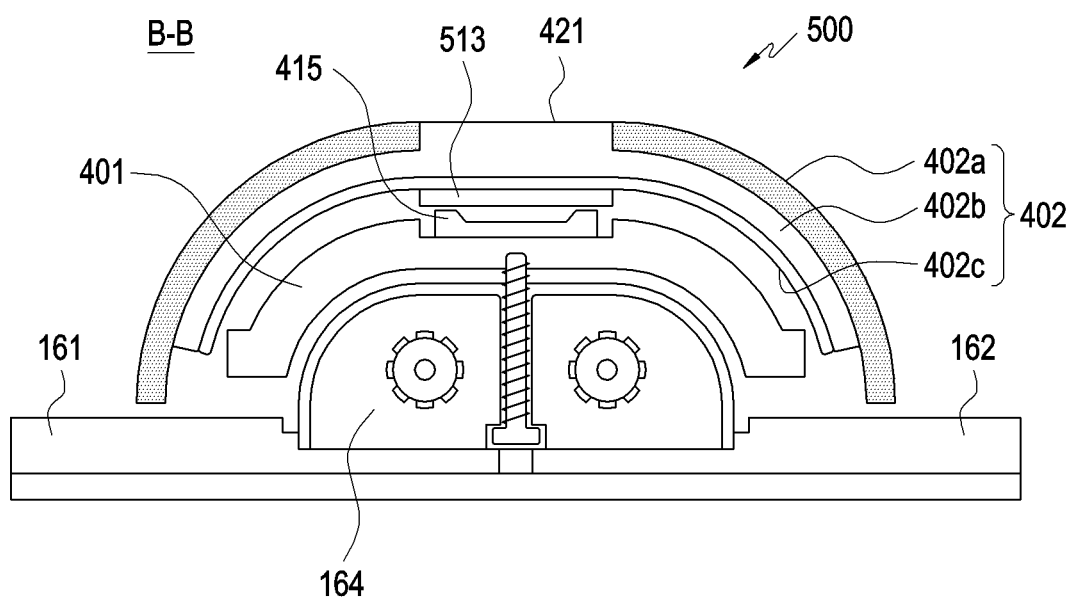
FIG. 11 is a cross-sectional view illustrating a hinge cover in which the hinge cover is cut in a direction perpendicular to the longitudinal direction according to an embodiment of the disclosure.

FIG. 11 is a cross-sectional view illustrating the hinge cover 500 in which the hinge cover 500 is cut in a direction perpendicular to the longitudinal direction according to an embodiment of the disclosure.

According to various embodiments, as the distance between the hinge case 401 and the optical cover 402 becomes smaller, miniaturization of the electronic device may be easier. For example, when the distance between the hinge case 401 and the optical cover 402 increases, the first housing structure and the second housing structure (e.g., the first housing structure 110 and the second housing structure 120 in FIGS. 1 to 3) may also increase. According to various embodiments disclosed herein, by reducing the distance between the hinge case 401 and the optical cover 402, it is possible to miniaturize the electronic device. For example, when the optical cover 402 is disposed closer to the hinge case 401, it is possible to reduce at least the thickness of the electronic device.

According to various embodiments, when the distance between the hinge case 401 and the optical cover 402 decreases, the area illuminated by light from the first light-emitting elements 415 on the inner face of the translucent region 421 also decreases, as described above. When the distance between the hinge case 401 and the optical cover 402 decreases, it is possible to provide uniform illumination throughout the translucent region 421 by arranging the first light-emitting elements 415 at smaller intervals. Referring to FIGS. 9 to 11, when the hinge case 401 and the optical cover 402 are disposed at a second distance D2 smaller than the first distance D1, the first light-emitting elements 415 may be arranged at a second interval I2 smaller than the first interval I1. For example, the area illuminated by the first light-emitting elements 415 is proportional to the distance between the hinge case 401 and the optical cover 402, and it is possible to provide uniform illumination throughout the translucent region 421 by adjusting the intervals between the first light-emitting elements in proportion to the distance between the hinge case 401 and the optical cover 402.

According to various embodiments, the first light-emitting elements 415 may be disposed on the opposite sides of the mounting portion 411a in the longitudinal direction of the hinge case 401 (e.g., the y-axis direction of FIG. 3). For example, when viewed from the outside of the hinge case 401, the first light-emitting elements 415 may be arranged side by side on the opposite sides of the mounting portion 411a. The width of the mounting portion 411a, for example, the length W3 of the mounting portion 411a measured in the longitudinal direction of the hinge case 401 may be larger than the second interval I2. For example, since the interval of the first light-emitting elements 415 disposed on the opposite sides of the mounting portion 411a are determined based on the length W3 of the mounting portion, the first light-emitting elements may be arranged further away from each other than the second interval I2. In an embodiment, since the first light-emitting elements 415 disposed at the opposite sides of the mounting portion 411a are arranged further away from each other than the second interval I2, a discontinuous section, in which illumination is not directly provided, may be formed in a portion corresponding to the mounting portion 411a in the translucent region 421.

According to various embodiments, when the electronic device (e.g., the electronic device 100 in FIGS. 1 to 3) or the hinge cover (e.g., the hinge cover 400 in FIG. 4) further includes at least one light guide 513, such a discontinuous section may be eliminated. For example, the light guide 513 is able to transfer a part of the light emitted from the first light-emitting elements 415 to the region corresponding to the mounting portion 411a. According to an embodiment, the light guide 513 may be disposed in the hinge case 401 and the optical cover 402 at a position corresponding to the mounting portion 411a. For example, in the longitudinal direction of the hinge case 401, the light guide 513 may be aligned between the first light-emitting elements 415. In another embodiment, one face of the light guide 513 may be attached to the hinge case 401, and the other face of the light guide 513 may be attached to the optical cover 402. In describing this embodiment, the light guide 513 is exemplified as a structure or a component mounted on the hinge case 401 or the optical cover 402, but the disclosure is not limited thereto. For example, the light guide 513 may be disposed on the hinge case 401 or the optical cover 402 in a manner such as printing, painting, or coating.

According to various embodiments, at least a portion of the light guide 513 may be disposed in a region illuminated by the first light-emitting element 415 adjacent thereto. For example, the light guide 513 is able to receive a part of light emitted from the first light-emitting element 415 adjacent thereto. In an embodiment, the light guide 513 may include a reflective layer 513a disposed on the side facing the hinge case 401 or a diffuse reflection pattern 513b disposed on the side facing the optical cover 402. Light incident on the light guide 513 may be transferred to the translucent region 421 from the region corresponding to the mounting portion 411a by the reflective layer 513a or the diffuse reflection pattern 513b. For example, a region where the light emitted from the first light-emitting element 415 does not directly arrive may be provided with light via the light guide 513.

According to various embodiments, the electronic device or the hinge cover 500 may further include a second light-emitting element so as to provide additional illumination to a discontinuous section, for example, a region corresponding to the mounting portion 411a. This will be described with reference to FIGS. 12 and 13.

Figure 12:
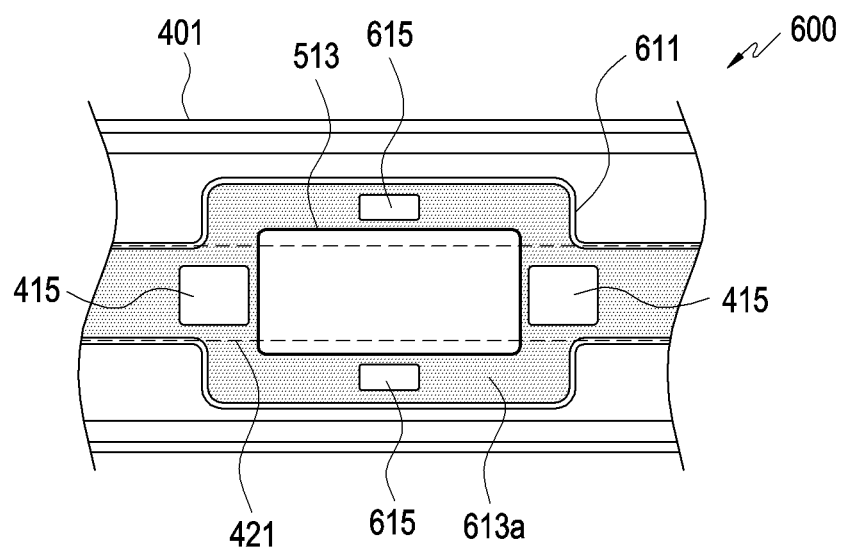
FIG. 12 is a projective plan view illustrating a portion of a hinge cover according to an embodiment of the disclosure.

FIG. 12 is a projective plan view illustrating a portion of a hinge cover 600 (e.g., the hinge cover 400 in FIG. 4) according to an embodiment of the disclosure.

Figure 13:
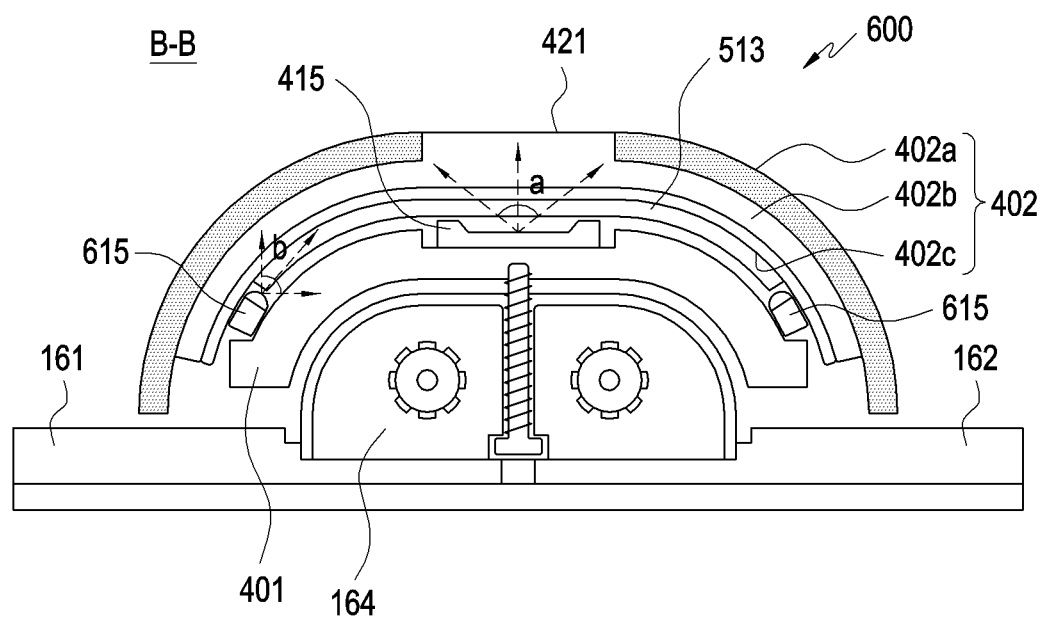
FIG. 13 is a cross-sectional view illustrating a hinge cover in which the hinge cover is cut in a direction perpendicular to the longitudinal direction according to an embodiment of the disclosure.

FIG. 13 is a cross-sectional view illustrating the hinge cover 600 in which the hinge cover 600 is cut in a direction perpendicular to the longitudinal direction according to an embodiment of the disclosure.

Referring to FIGS. 12 and 13, the hinge cover 600 (e.g., the hinge cover 165 or 400 in FIGS. 1 to 4) may further include at least one second light-emitting element 615 mounted on the outer face of the hinge case 401. For example, the second light-emitting element 615 may be mounted on a placement portion 613a of a flexible printed circuit board disposed in an accommodation recess 611. In an embodiment, a pair of second light-emitting elements 615 may be disposed adjacent to the opposite edges of the hinge case 401 or may be disposed to face the opposite edges of the light guide 513. The second light-emitting elements 615 may be side-emitting-type light emitting diodes, and may emit light into the light guide 513. The light guide 513 may transfer the light incident thereon by the second light-emitting elements 615 using the reflective layer or the diffuse reflection pattern (e.g., the reflective layer 513a or the diffuse reflection pattern 513b in FIG. 9) to the translucent region 421. For example, illumination may be provided via the second light-emitting elements 615 and the light guide 513 to a region where the illumination of the first light-emitting elements 415 does not directly arrive.

According to various embodiments, the illumination angle (e.g., the illumination angle a in FIG. 6 or FIG. 13) of the first light-emitting element 415 may be, for example, about 120 degrees. According to an embodiment, the second light-emitting elements 615 may have an illumination angle b of approximately 120 degrees, and may emit light to the light guide 513 from one side of the mounting portion (e.g., the mounting portion 411a in FIG. 6 or FIG. 7). For example, at least a portion of the region corresponding to the mounting portion 411a may transmit light emitted from the first light-emitting elements 415 and light emitted from the second light-emitting elements 615 to the outside.

According to the above-described embodiments, at the first position (e.g., the state of FIG. 1) at which the first housing structure 110 and the second housing structure 120 are unfolded to be arranged side by side with respect to each other, the translucent region 421 may be at least partially concealed by the first housing structure or the second housing structure. At the second position (e.g., the state of FIG. 2) at which the first housing structure 110 and the second housing structure 120 are folded to face each other, the translucent region 421 may be exposed to the outside. In an embodiment, when an event occurs at the second position, the electronic device (e.g., the electronic device 100 in FIG. 2) may provide visual information through the translucent region 421 using one or more first light-emitting elements 415. For example, even in an environment in which providing visual information through a display (e.g., the display 130 or the sub-display 152 in FIG. 1) is limited, the user may easily recognize whether a call or a message is received. In another embodiment, in the region where illumination of the first light-emitting elements 415 does not arrive, the second light-emitting element 615 or the light guide 513 may be disposed so as to provide illumination to the translucent region 421.

Figure 14:
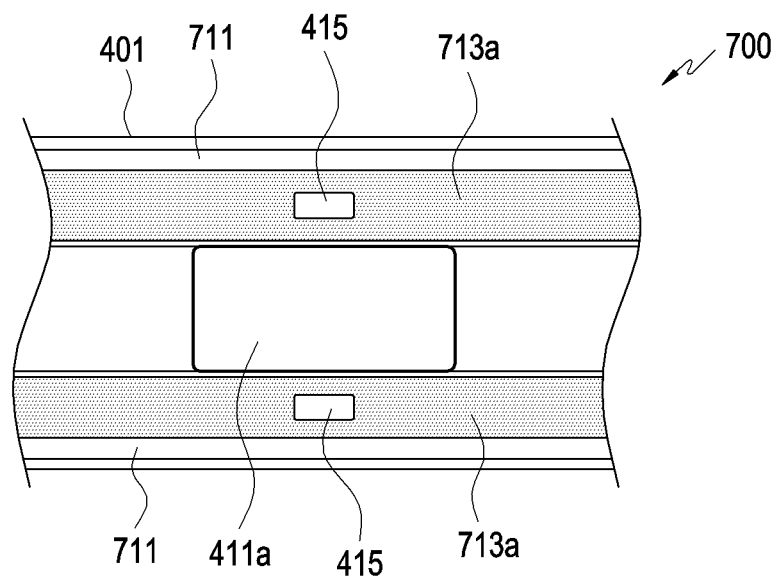
FIG. 14 is a projective plan view illustrating a portion of a hinge cover according to an embodiment of the disclosure.

FIG. 14 is a projective plan view illustrating a portion of the hinge cover 700 according to an embodiment of the disclosure.

Figure 15:
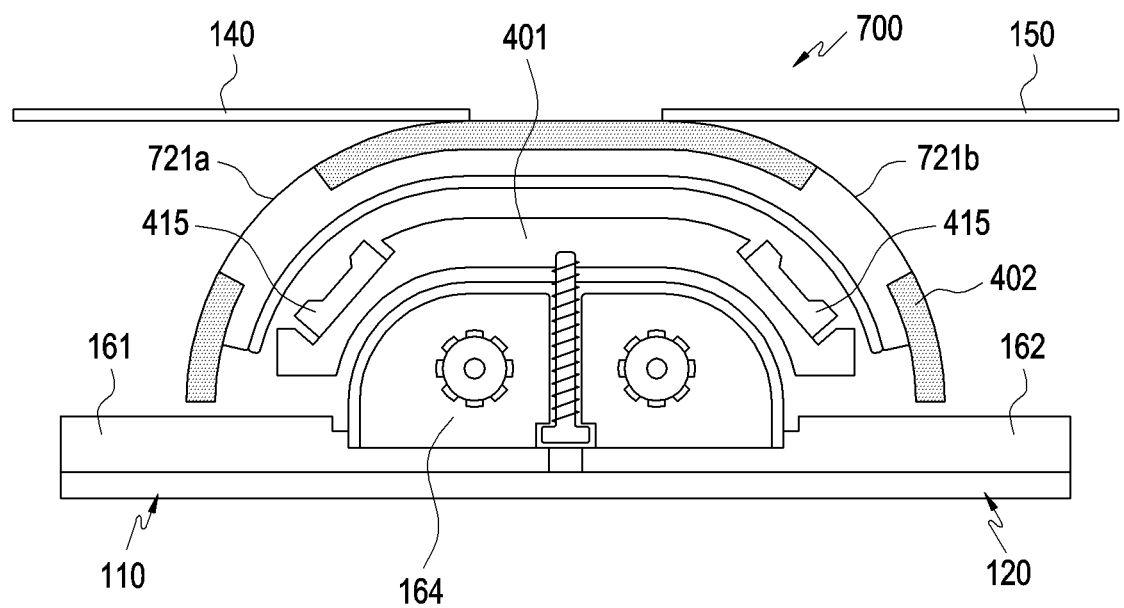
FIG. 15 is a cross-sectional view illustrating a hinge cover in which the hinge cover is cut in a direction perpendicular to the longitudinal direction according to an embodiment of the disclosure.

FIG. 15 is a cross-sectional view illustrating the hinge cover 700 in which the hinge cover 700 is cut in a direction perpendicular to the longitudinal direction according to an embodiment of the disclosure.

Figure 16:
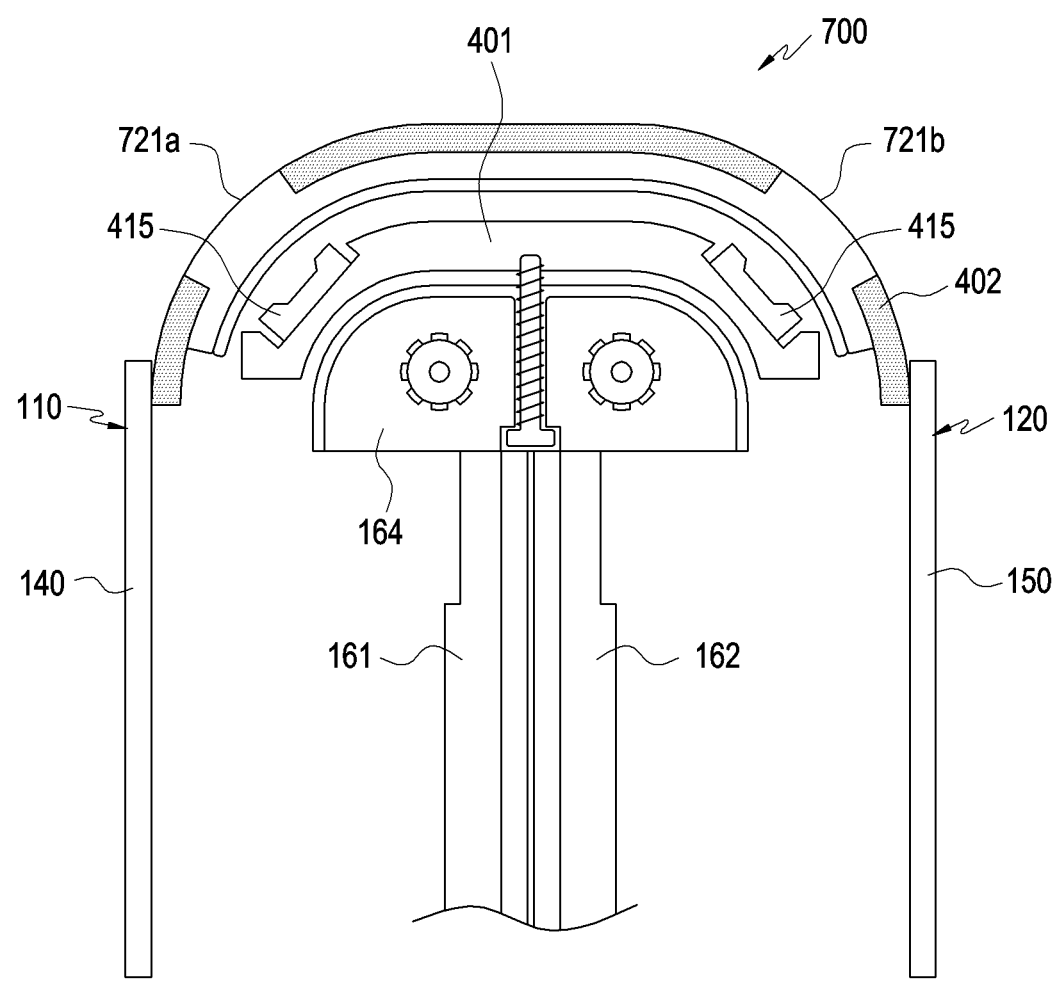
FIG. 16 is a cross-sectional view illustrating a hinge cover in which the hinge cover is cut in a direction perpendicular to the longitudinal direction according to an embodiment of the disclosure.

FIG. 16 is a cross-sectional view illustrating the hinge cover 700 in which the hinge cover 600 is cut in a direction perpendicular to the longitudinal direction according to an embodiment of the disclosure.

Referring to FIGS. 14 and 16, an electronic device (e.g., the electronic device 100 in FIGS. 1 to 3) may further include a plurality of first light-emitting elements 415 arranged in two rows in the longitudinal direction on the hinge cover 700. A placement portion 713*a* of the flexible printed circuit board (e.g., the flexible printed circuit board 413 in FIG. 4) may extend substantially in the longitudinal direction of the hinge cover 700 (e.g., they direction in FIG. 3). A pair of placement portions 713*a* may be disposed adjacent to respective edges of the hinge case 401. For example, a pair of accommodation recesses 711 extending in the longitudinal direction may be formed parallel to each other on the outer face of the hinge case 401, and the placement portions 713*a* may be accommodated in the accommodation recesses 711, respectively. The mounting portion 411*a* to which the hinge structure (e.g., the hinge structure 164 in FIG. 4) is coupled may be located between the placement portions 713*a* (or between the accommodation portions 711). An optical cover (e.g., the optical cover 402 in FIG. 4) may include a plurality of translucent regions 721*a* and 721*b* corresponding to the arrangement of the first light-emitting elements 415, thereby transmitting light, emitted from the first light-emitting elements 415, to the outside.

Referring to FIG. 15, at the first position, for example, when the first housing structure 110 and the second housing structure 120 are located at the first position are unfolded to be arranged side by side with respect to each other, one or more first light-emitting elements 415 on one side (e.g., the first light-emitting element 415 on the left side in FIG. 15, which is referred to as a "first row light-emitting element" below) may be concealed by the first housing structure 110. At the first position, one or more first light-emitting elements 415 on the other side (e.g., the first light-emitting element 415 on the right side in FIG. 15, which is referred to as a "second row light-emitting element" below) may be concealed by the second housing structure 120.

Referring to FIG. 16, at the second position, for example, when the first housing structure 110 and the second housing structure 120 are folded to face each other, both the first row light-emitting element and the second row light-emitting element may be exposed to the outside. For example, as the first housing structure 110 or the second housing structure 120 rotates with respect to the hinge cover 700, one or more regions of the hinge cover 700 may be concealed to the inside of the first housing structure 110 or the second housing structure 120 or may be exposed to the outside of the first housing structure 110 or the second housing structure 120. The first light-emitting elements 415 may emit light to the outside of the electronic device through the translucent regions 721*a* and 721*b* at the second position.

According to various embodiments, when the electronic device (e.g., the electronic device 100 of FIG. 2) is placed on a flat face of a table or the like at the state of the second position, the outer face of the first housing structure 110 or the second housing structure 120 (e.g., the first rear cover 140 or the second rear cover 150 in FIG. 4) may be located to face the flat face. In an embodiment, the above-mentioned hinge cover 165, 400, 500, 600, or 700 or the optical cover 402 may be exposed to the external space even if the electronic device is placed on a flat face at the state of the second position. For example, an indicator (e.g., the indicator 169 in FIG. 2) or a translucent region (e.g., the translucent region 421, 721*a*, or 721*b* in FIG. 4 or FIG. 16) may be at least partially exposed to the external space. For example, in an environment in which providing visual information through a display (e.g., the display 130 or the sub-display 152 in FIG. 1) is limited, the electronic device 100 may visually provide information about occurrence of an event or the like to the user using the indicator 169.

According to various embodiments disclosed herein, an electronic device (e.g., the electronic device 100 in FIGS. 1 to 3) may include: a first housing structure (e.g., the first housing structure 110 in FIGS. 1 to 3) including a first face (e.g., the first face 111 in FIGS. 1 to 3) oriented in a first direction, a second face (e.g., the second face 112 in FIGS. 1 to 3) oriented in a second direction opposite the first direction, and a first side member (e.g., the first side member 113 in FIGS. 1 to 3) at least partially surrounding a space between the first face and the second face; a second housing structure (e.g., the second housing structure 120 in FIGS. 1 to 3) including a third face (e.g., the third face 121 in FIGS. 1 to 3) oriented in a third direction, a fourth face (e.g., the fourth face 122 in FIGS. 1 to 3) oriented in a fourth direction opposite the third direction, and a second side member (e.g., the second side member 123 in FIGS. 1 to 3) at least partially surrounding a space between the third face and the fourth face; a hinge structure (e.g., the hinge structure 164 in FIG. 3 or FIG. 4) rotatably connecting the first housing structure and the second housing structure to each other, the hinge structure being configured to provide a folding axis (e.g., the folding axis A in FIG. 1) that is a rotating center of the first housing structure and the second housing structure; a flexible display (e.g., the display 130 in FIG. 1 or FIG. 3) extending from the first face to the third face across the hinge structure; a hinge case (e.g., the hinge case 401 in FIG. 4) disposed between the first housing structure and the second housing structure to accommodate the hinge structure therein so as to conceal or protect the hinge structure; and at least one first light-emitting element (e.g., the first light-emitting element 415 in FIG. 4) disposed on an outer face of the hinge case. The electronic device may transmit light, emitted from the first light-emitting element, to the outside.

According to various embodiments, the electronic device described above may further include an optical cover (e.g., the optical cover 402 in FIG. 4 or FIG. 6) mounted on the outer face of the hinge case, and the first light-emitting element may be concealed by the optical cover.

According to various embodiments, the optical cover includes a translucent region (e.g., the translucent region 421 in FIG. 4 or FIG. 6), and the translucent region is disposed to correspond to the first light-emitting element so as to transmit light, emitted from the first light-emitting element, to the outside.

According to various embodiments, the first housing structure and the second housing structure may rotate about the hinge structure between a position at which the first housing structure and the second housing structure are unfolded to be arranged side by side with respect to each other (the state of FIG. 1) (hereinafter, referred to as a "first position") and a position at which the first face and the third face are folded to face each other (the state of FIG. 2) (hereinafter, referred to as a "second position"), and at the second position, at least a portion of the translucent region may be exposed to the outside.

According to various embodiments, at the first position, the translucent region may be concealed by the first housing structure or the second housing structure.

According to various embodiments, the optical cover may include an opaque layer (e.g., the opaque layer 402a in FIG. 8), a translucent layer (e.g., the translucent layer 402b in FIG. 8) disposed on an inner face of the opaque layer, a portion of translucent layer being exposed to outside of the opaque layer, and a diffusion layer (e.g., the diffusion layer 402c in FIG. 8) disposed on an inner face of the translucent layer and directly facing at least partially the first light-emitting element.

According to various embodiments, in the longitudinal direction of the hinge case, the hinge structure may be mounted on the central portion of the inner face of the hinge case (e.g., the mounting portion 411a in FIG. 4), and when the hinge case is viewed from the outer face thereof, the first light-emitting element is mounted at each side of a portion in which the hinge structure is mounted.

According to various embodiments, the electronic device may further include an optical cover mounted on the outer face of the hinge case and including translucent regions corresponding to at least the first light-emitting elements, and regions illuminated by the first light-emitting elements on the inner face of the translucent region may at least partially overlap each other.

According to various embodiments, the electronic device may further include an optical cover mounted on the outer face of the hinge case and including a translucent region corresponding to the first light-emitting elements, and at least one light guide (e.g., the light guide 513 in FIG. 9 or FIG. 13) disposed between the hinge case and the optical cover at a position corresponding to the portion in which the hinge structure is mounted, and aligned between the first light-emitting elements.

According to various embodiments, the electronic device may further include at least one second light-emitting element (e.g., the second light-emitting element 615 in FIG. 13) mounted on the outer face of the hinge case and configured to cause light to enter the light guide.

According to various embodiments, the second light-emitting element may include a side-emitting-type light-emitting diode.

According to various embodiments, the light guide may include a reflective layer or a diffuse reflection pattern (e.g., the reflective layer 513a or the diffuse reflection pattern 513b in FIG. 9).

According to various embodiments, the electronic device may further include an accommodation recess (e.g., the accommodation recess 411 in FIG. 4 or FIG. 6) formed in the outer face of the hinge case, and a flexible printed circuit board (e.g., the flexible printed circuit board 413 in FIG. 4) at least partially disposed in the accommodation recess, and the first light-emitting elements are mounted on the flexible printed circuit board.

According to various embodiments, the plurality of first light-emitting elements may be arranged in a longitudinal direction of the hinge case.

According to various embodiments, the first housing structure and the second housing structure may rotate about the hinge structure between a position at which the first housing structure and the second housing structure are unfolded to be arranged side by side with respect to each other (hereinafter, referred to as a "first position") and a position at which the first face and the third face are folded to face each other (hereinafter, referred to as a "second position"). The electronic device may include one or more first light-emitting elements (e.g., the left light-emitting element among the first light-emitting elements 415 in FIG. 15) disposed in a region concealed by the first housing structure at the first position and exposed to the outside at the second position, and one or more other first light-emitting elements (e.g., the right light-emitting element among the first light-emitting elements 415 in FIG. 15) disposed in a region concealed by the second housing structure at the first position and exposed to the outside at the second position.

According to various embodiments disclosed herein, an electronic device may include: a first housing structure; a second housing structure; a hinge structure disposed between the first housing structure and the second housing structure, the hinge structure being configured to couple the first housing structure and the second housing structure to be rotatable between a position at which the first housing structure and the second housing structure are unfolded to be arranged side by side with respect to each other (hereinafter, referred to as a "first position") and a position at which the first and second housing structures are folded to face each other (hereinafter, referred to as a "second" position); a flexible display extending from one face of the first housing structure to one face of the second housing structure across the hinge structure; a hinge case disposed between the first housing structure and the second housing structure to accommodate the hinge structure therein so as to conceal or protect the hinge structure; at least one first light-emitting element disposed on an outer face of the hinge case; and an optical cover mounted on the outer face of the hinge case and including a translucent region formed in a region at least corresponding to the first light-emitting element. The first light-emitting element may emit light to the outside of the electronic device through the translucent region.

According to various embodiments, the translucent region may be exposed to the outside of the electronic device at least at the second position.

According to various embodiments, at the first position, the translucent region may be exposed to the outside of the electronic device between another face of the first housing structure and another face of the second housing structure.

According to various embodiments, a plurality of first light-emitting elements may be arranged on the outer face of the hinge case, and regions illuminated by the first light-emitting elements on the inner face of the translucent region may at least partially overlap each other.

According to various embodiments, the hinge structure may be mounted on the inner face of the hinge case, and at least one pair of first light-emitting elements are mounted on the outer face of the hinge case. The at least one pair of first light-emitting elements may be aligned in a longitudinal direction of the hinge case with a portion in which the hinge structure is mounted interposed therebetween.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a first housing structure including:
 a first face oriented in a first direction,
 a second face oriented in a second direction opposite the first direction, and
 a first side member at least partially surrounding a space between the first face and the second face;

a second housing structure including:
  a third face oriented in a third direction,
  a fourth face oriented in a fourth direction opposite the third direction, and
  a second side member at least partially surrounding a space between the third face and the fourth face;
a hinge structure rotatably connecting the first housing structure and the second housing structure to each other, the hinge structure configured to provide a folding axis that is a rotating center of the first housing structure and the second housing structure;
a flexible display extending from the first face to the third face across the hinge structure;
a hinge case disposed between the first housing structure and the second housing structure to accommodate the hinge structure therein to conceal or protect the hinge structure; and
one or more first light-emitting elements disposed on an outer face of the hinge case,
wherein the electronic device is configured to transmit light emitted from the one or more first light-emitting elements to outside of the electronic device, and
wherein the electronic device includes:
  one or more first light-emitting elements disposed in a region concealed by the first housing structure at a first position and exposed to an outside at a second position, and
  one or more other first light emitting elements disposed in a region concealed by the second housing structure at the first position and exposed to the outside at the second position.

2. The electronic device of claim 1, further comprising:
an optical cover mounted on the outer face of the hinge case,
wherein the one or more first light-emitting elements are concealed by the optical cover.

3. The electronic device of claim 2,
wherein the optical cover includes a translucent region, and
wherein the translucent region is disposed to correspond to the one or more first light-emitting elements to transmit light emitted from the one or more first light-emitting elements to outside of the electronic device.

4. The electronic device of claim 3,
wherein the first housing structure and the second housing structure are configured to rotate about the hinge structure between a first position at which the first housing structure and the second housing structure are unfolded to be arranged side by side with respect to each other and a second position at which the first face and the third face are folded to face each other, and
wherein, at the second position, at least a portion of the translucent region is exposed to outside of the electronic device.

5. The electronic device of claim 4, wherein at the first position, the translucent region is concealed by at least one of the first housing structure or the second housing structure.

6. The electronic device of claim 3, wherein the optical cover includes:
an opaque layer;
a translucent layer disposed on an inner face of the opaque layer, a portion of translucent layer being exposed to outside of the opaque layer; and
a diffusion layer disposed on an inner face of the translucent layer and directly facing at least partially the one or more first light-emitting elements.

7. The electronic device of claim 1,
wherein, in a longitudinal direction of the hinge case, the hinge structure is mounted on a central portion of an inner face of the hinge case, and
wherein, based on the hinge case being viewed from an outer face thereof, the one or more first light-emitting elements being mounted at each side of a portion in which the hinge structure is mounted.

8. The electronic device of claim 7, further comprising:
an optical cover mounted on the outer face of the hinge case and including translucent regions corresponding to the one or more first light-emitting elements,
wherein regions illuminated by the one or more first light-emitting elements on an inner face of the translucent region at least partially overlap each other.

9. The electronic device of claim 7, further comprising:
an optical cover mounted on the outer face of the hinge case and including a translucent region corresponding to the one or more first light-emitting elements; and
at least one light guide disposed between the hinge case and the optical cover at a position corresponding to the portion in which the hinge structure is mounted, and aligned between the one or more first light-emitting elements.

10. The electronic device of claim 9, further comprising:
one or more second light-emitting elements mounted on the outer face of the hinge case and configured to cause light to enter the light guide.

11. The electronic device of claim 10, wherein the one or more second light-emitting elements include a side-emitting-type light-emitting diode.

12. The electronic device of claim 9, wherein the light guide includes at least one of a reflective layer or a diffuse reflection pattern.

13. The electronic device of claim 7, further comprising:
an accommodation recess formed in the outer face of the hinge case; and
a flexible printed circuit board at least partially disposed in the accommodation recess,
wherein the one or more first light-emitting elements are mounted on the flexible printed circuit board.

14. The electronic device of claim 1, wherein a plurality of first light-emitting elements are arranged in a longitudinal direction of the hinge case.

15. The electronic device of claim 1,
wherein the first housing structure and the second housing structure are configured to rotate about the hinge structure between the first position at which the first housing structure and the second housing structure are unfolded to be arranged side by side with respect to each other and the second position at which the first face and the third face are folded to face each other.

16. An electronic device comprising:
a first housing structure;
a second housing structure;
a hinge structure disposed between the first housing structure and the second housing structure, the hinge structure being configured to couple the first housing structure and the second housing structure to be rotatable between a first position at which the first housing structure and the second housing structure are unfolded to be arranged side by side with respect to each other and a second position at which the first and second housing structures are folded to face each other;
a flexible display extending from one face of the first housing structure to one face of the second housing structure across the hinge structure;

a hinge case disposed between the first housing structure and the second housing structure to accommodate the hinge structure therein so as to conceal or protect the hinge structure;

one or more first light-emitting elements disposed on an outer face of the hinge case; and an optical cover mounted on the outer face of the hinge case and including a translucent region formed in a region at least corresponding to the one or more first light-emitting elements, wherein the one or more first light-emitting elements are configured to emit light to outside of the electronic device through the translucent region, and wherein the electronic device includes:
one or more first light-emitting elements disposed in a region concealed by the first housing structure at the first position and exposed to an outside at the second position, and one or more other first light emitting elements disposed in a region concealed by the second housing structure at the first position and exposed to the outside at the second position.

17. The electronic device of claim 16, wherein the translucent region is exposed to outside of the electronic device at least at the second position.

18. The electronic device of claim 16, wherein at the first position, the translucent region is exposed to outside of the electronic device between another face of the first housing structure and another face of the second housing structure.

19. The electronic device of claim 16, wherein the one or more first light-emitting elements are arranged on the outer face of the hinge case, and wherein a plurality of regions illuminated by the one or more first light-emitting elements on an inner face of the translucent region at least partially overlap each other.

20. The electronic device of claim 16, wherein the hinge structure is mounted on an inner face of the hinge case, and at least one pair of one or more first light-emitting elements are mounted on the outer face of the hinge case, and wherein the at least one pair of the one or more first light-emitting elements are aligned in a longitudinal direction of the hinge case with a portion in which the hinge structure being mountingly interposed therebetween.

* * * * *